United States Patent [19]

Katircioglu et al.

[11] Patent Number: 4,918,378
[45] Date of Patent: Apr. 17, 1990

[54] METHOD AND CIRCUITRY FOR ENABLING INTERNAL TEST OPERATIONS IN A VLSI CHIP

[75] Inventors: Haluk Katircioglu, Irvine; John A. De Beule, Rancho Santa Margarita; Debaditya Mukherjee, El Toro, all of Calif.

[73] Assignee: Unisys Corporation, Blue Bell, Pa.

[21] Appl. No.: 364,412

[22] Filed: Jun. 12, 1989

[51] Int. Cl.[4] .............................................. G01R 31/28
[52] U.S. Cl. .................................. 365/201; 371/21.2; 371/22.4; 371/22.5
[58] Field of Search .................... 324/73 R, 73 AT; 371/21.1, 21.2, 21.3, 21.4, 22.1, 22.5, 25.1; 365/201

[56] References Cited

U.S. PATENT DOCUMENTS 4,701,920 10/1987 Resnick et al. ............... 324/73 R
4,764,926 8/1988 Knight et al. ................. 371/22.5
4,768,196 8/1988 Jou et al. ...................... 371/22.4
4,827,476 5/1989 Garcia .......................... 371/21.1

Primary Examiner—Ernest F. Karlsen
Attorney, Agent, or Firm—Alfred W. Kozak; Nathan Cass; Robert S. Bramson

[57] ABSTRACT

A method for internal self-testing is provided for a VLSI chip having gates, logic, registers, memory circuitry, etc. The registers are connected into a shift chain circuit form. A set of control flip-flops operate to convert the registers to multifunction shift registers (MFSR's) which operate as flip-flops during a test cycle and as latches during normal operations. Selected MFSR's function to generate test patterns to the chip circuitry which have output signals to an output MFSR which collects a signature that can be compared to a predetermined signature to determine error-free or error-incurred operation of the VLSI circuitry.

10 Claims, 28 Drawing Sheets

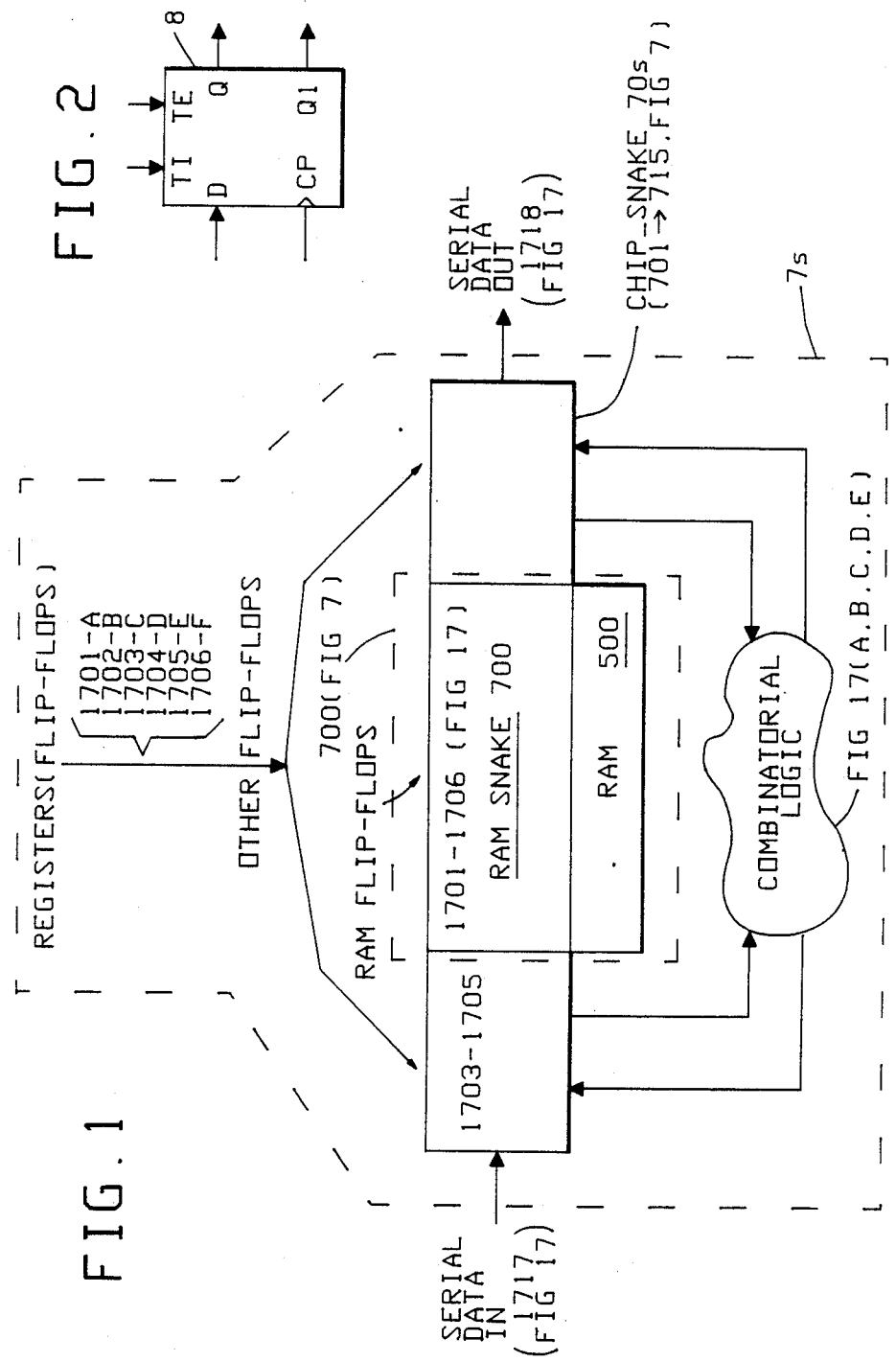

FIG.6

INPUTS:

```
RAD(3:0)    (507) READ ADDRESS INPUT BUS
RADSI(3:0)  (508) READ ADDRESS SERIAL DAT INPUT BUS
WAD(3:0)    (501) WRITE ADDRESS INPUT BUS
WADSI(3:0)  (502) WRITE ADDR. SERIAL DATA INPUT BUS
WDI(59:0)   (504) WRITE DATA INPUT BUS
CLK         (510) CLOCK INPUT
SCAN        (511) SHIFT CONTROL INPUT
SDI(59:0)   (505) DATA REG. SERIAL DATA INPUT BUS
WEN(6:0)    (516) WRITE ENABLE INPUT BUS
WENSI(6:0)  (515) WRITE ENABLE SERIAL DATA INPUT BUS
DDSDI       (513) DDRIVE REGISTER SERIAL DATA INPUT
ST0,ST1     (517) SELF TEST CONTROL INPUTS
```

OUTPUTS:

```
RADSO(3:0)  (509) READ ADDR. SERIAL DATA OUTPUT BUS
RDO(59:0)   (506) READ DATA OUTPUT BUS
WADSO(3:0)  (503) WRITE ADDR. SERIAL DATA OUTPUT BUS
WENSO(6:0)  (514) WRITE ENABLE SER. DATA OUTPUT BUS
DDSDO       (512) DDRIVE REGISTER SERIAL DATA OUTPUT
```

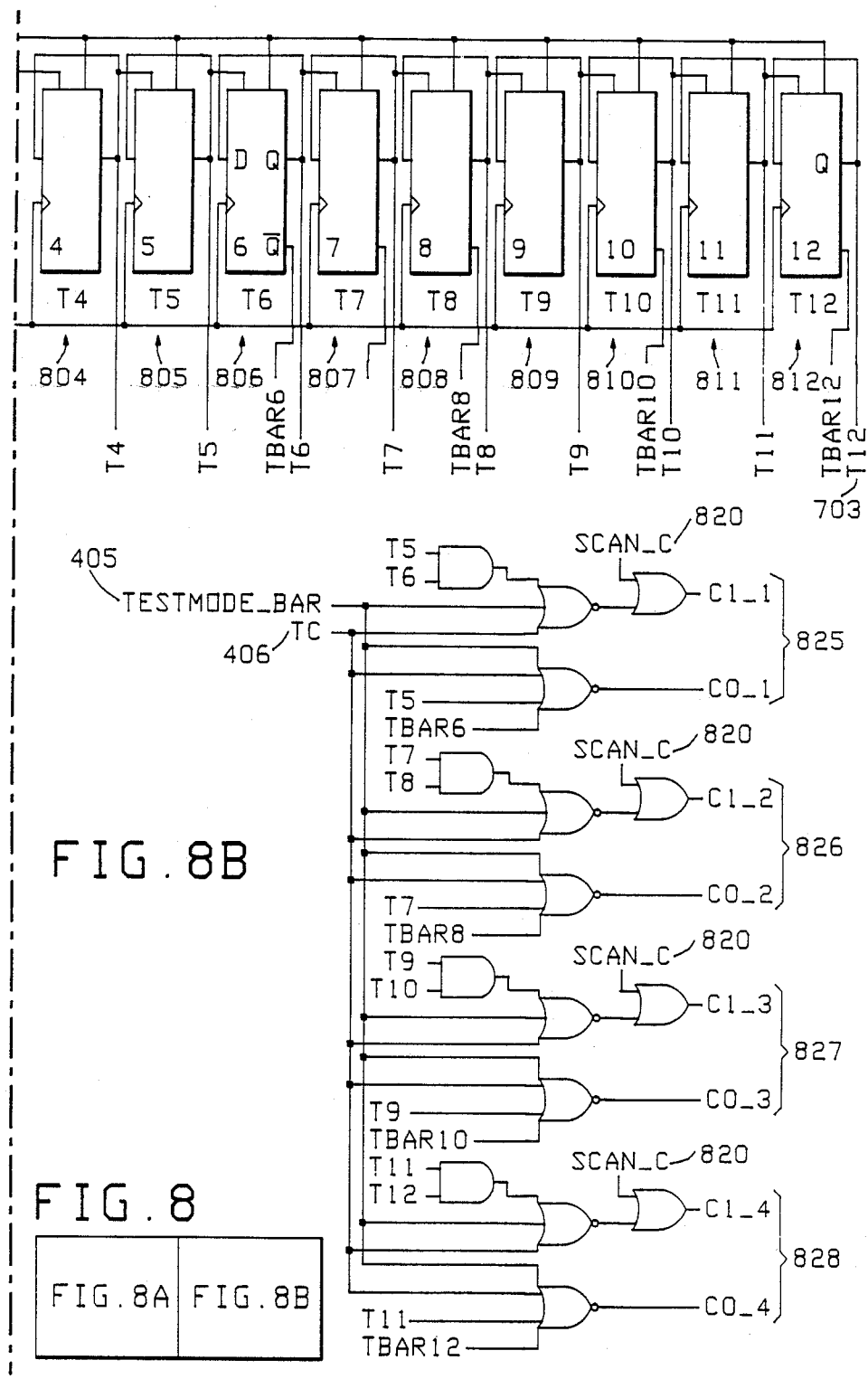

| SEL_BAR | SHIFT_BAR | HOLD_BAR | TESTMODE_BAR | TC | T FLIP-FLOP | SCAN C, | SCAN | STI. | STO | C1_O, | CO_O |
|---|---|---|---|---|---|---|---|---|---|---|---|
| 1 | 1 | 1 | 1 | X | $T_{0-12}=X$ | 0 | 0 | 0 | 0 | 0 | 0 |
| 0 | 0 | 0 | 1 | X | $T_{0-12}=X$ | 1 | 1 | 0 | 0 | 1 | 0 |
| 0 | 1 | 0 | 1 | X | $T_{0-12}=X$ | 0 | 1 | 0 | 0 | 0 | 0 |
| 1 | 1 | 0 | 1 | X | $T_{0-12}=X$ | 0 | 1 | 0 | 0 | 0 | 0 |
| 1 | 0 | 0 | 1 | X | $T_{0-12}=X$ | 0 | 1 | 0 | 0 | 0 | 0 |
| 1 | 1 | 0 | 0 | 0 | $T_{0-12}=X$ REQUIRED CONFIG. | 0 | 1 | f(T2, | T3) | f(T0, | T1) |
| 1 | 1 | 0 | 0 | 1 | $T_{0-12}=X$ | 0 | 1 | 0 | 0 | 0 | 0 |
| OTHER COMBINA- TIONS | | | | | | | | | | | |

FIG. 9A

| C1_W. CO_W | C1_1. CO_1 | C1_2. CO_2 | C1_3. CO_3 | C1_4. CO_4 |
|---|---|---|---|---|
| 0  0 | 0  0 | 0  0 | 0  0 | 0  0 |
| 0  1 | 1  0 | 1  0 | 1  0 | 1  0 |
| 0  0 | 0  0 | 0  0 | 0  0 | 0  0 |
| 0  0 | 0  0 | 0  0 | 0  0 | 0  0 |
| 0  0 | 0  0 | 0  0 | 0  0 | 0  0 |
| f(T0,T1) | f(T5,T6) | f(T7,T8) | f(T9,T10) | f(T11,T12) |
| 0  0 | 0  0 | 0  0 | 0  0 | 0  0 |

FIG.9B

| CONT | FUNCTIONS PERFORMED |
|---|---|
| 1 | RAM CELL IS IN NORMAL OPERATION MODE. ALL RAM REGISTERS ARE IN PARALLEL LOAD MODE. T FLIP-FLOPS ARE IN HOLD MODE. |
| 0 | T FLIP-FLOPS AND THE REGISTERS ARE IN SHIFT MODE. SDI IS SHIFTED IN WITH EACH CLOCK RISING EDGE. TOTALLY 90 CLOCKS ARE REQUIRED FOR A COMPLETE SHIFT. |
| 1 | ALL T FLIP-FLOPS AND THE RAM REGISTERS ARE IN HOLD MODE. |
| 1 | ALL T FLIP-FLOPS AND THE RAM REGISTERS ARE IN HOLD MODE. |
| 0 | ALL T FLIP-FLOPS AND THE RAM REGISTERS ARE IN HOLD MODE. |
| 1 | TESTMODE. T FLIP-FLOPS DETERMINE THE TEST FUNCTION TO BE PERFORMED. ALL CONTROL SIGNALS ARE FUNCTIONS OF T FLIP-FLOPS. T FLIP-FLIPS ARE IN HOLD MODE. THE RAM REGISTERS ARE IN EITHER HOLD OR PATTERN GENERATION OR SIGNAL COLLECTION MODE, AS DETERMINED BY THE RESPECTIVE T FLIP-FLOPS. |
| 1 | SINCE TC (TERMINAL COUNT) IS REACHED WHEN IN TEST MODE, ALL THE RAM REGISTERS GO WITH HOLD MODE. T FLIP-FLOPS CONTINUE TO BE IN HOLD MODE. |
|  | NOT VALID |

| FIG. 9A | FIG. 9B | FIG. 9C |
|---|---|---|

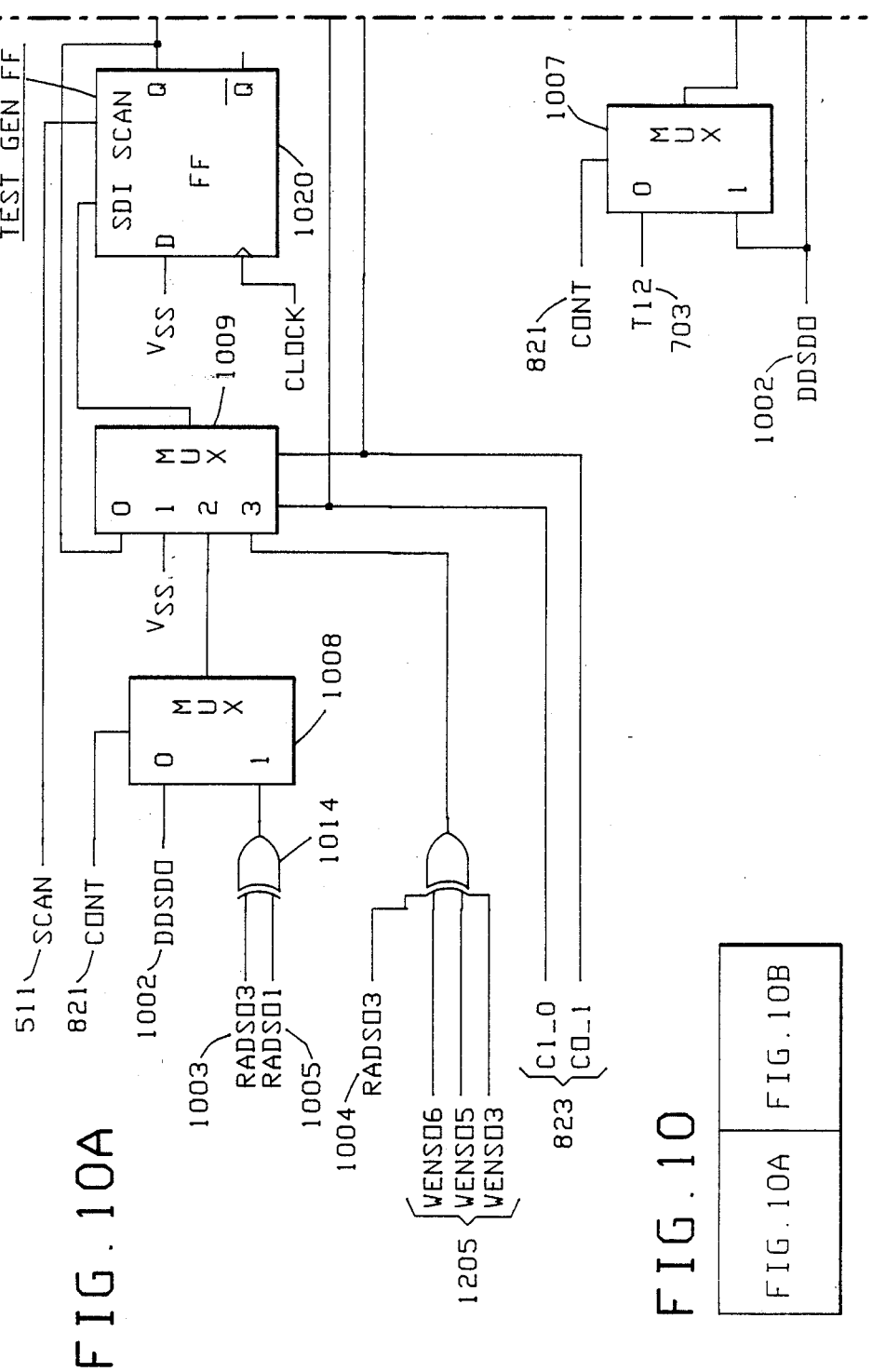

FIG. 18A1

| STEP | FUNCTION PERFORMED |
|---|---|
| 1 | WRITE RANDOM DATA IN ALL LOCATIONS, STARTING AT ADDRESS ZERO. INCREMENT WRITE ADDRESSS FROM ZERO TO n(HIGHEST ADDRESS). |
| 2 | COLLECT SIGNATURE OF RAM DATA. |
| 3 | LOAD WRITE ENABLE REGISTER WITH PATTERN '01010101'. WRITE ALL ONES IN LOCATIONS OF RAM. |
| 4 | COLLECT SIGNATURE OF RAM DATA. |
| 5 | WRITE RANDOM DATA IN ALL LOCATIONS, STARTING AT n (HIGHEST ADDRESS). DECREMENT ADDRESS FROM n TO ZERO. |
| 6 | COLLECT SIGNATURE OF RAM DATA. |
| 7 | LOAD WRITE ENABLE REGISTER WITH PATTERN '10101010'. WRITE ALL ONES IN ALL LOCATIONS OF RAM. |
| 8 | COLLECT SIGNATURE OF RAM DATA. |
| 9 | WRITE ALL ZEROES IN ALL LOCATIONS OF RAM. |
| 10 | COLLECT SIGNATURE OF RAM DATA. |

FIG. 18A2

| T FLIP FLOPS (BINARY) | D DRIVE FF | TEST GEN. FF | READ ADDRESS REGISTER SEED(HEX)/ CONFIGURATION | WRITE ADDRESS REGISTER SEED(HEX)/ CONFIGURATION |
|---|---|---|---|---|
| $T_1 T_0 = 01$<br>$T_3 T_2 = 01$<br>$T_4 = 1$<br>$T_6 T_5 = 01$<br>$T_8 T_7 = 01$<br>$T_{10} T_9 = 01$<br>$T_{10} T_{11} = 01$ | 1 | 0 | 0/PATTERN GENERATE (RANDOM) | 0/COUNT UP |
| $T_0 - T_{12} = 1$ | 1 | 0 | 1/PATTERN GENERATE (RANDOM) | 0/COUNT UP |
| $T_1 T_0 = 01$<br>$T_3 T_2 = 01$<br>$T_4 = 1$<br>$T_6 T_5 = 11$<br>$T_8 T_7 = 11$<br>$T_{10} T_9 = 11$<br>$T_{12} T_{11} = 11$ | 1 | 0 | 0/PATTERN GENERATE (RANDOM) | 0/COUNT UP |
| $T_0 - T_{12} = 1$ | 1 | 0 | 1/PATTERN GENERATE (RANDOM) | 0/COUNT UP |
| $T_1 T_0 = 01$<br>$T_3 T_2 = 01$<br>$T_4 = 0$<br>$T_6 T_5 = 01$<br>$T_8 T_7 = 01$<br>$T_{10} T_9 = 01$<br>$T_{12} T_{11} = 01$ | 1 | 0 | 0/PATTERN GENERATE (RANDOM) | F/COUNT DOWN |
| $T_0 - T_{12} = 1$ | 1 | 0 | 1/PATTERN GENERATE (RANDOM) | 0/COUNT UP |
| $T_1 T_0 = 01$<br>$T_3 T_2 = 01$<br>$T_4 = 1$<br>$T_6 T_5 = 01$<br>$T_8 T_7 = 01$<br>$T_{10} T_9 = 01$<br>$T_{12} T_{11} = 01$ | 1 | 0 | 0/PATTERN GENERATE (RANDOM) | 0/COUNT UP |
| $T_0 - T_{12} = 1$ | 1 | 0 | 1/PATTERN GENERATE (RANDOM) | 0/COUNT UP |
| $T_1 T_0 = 01$<br>$T_3 T_2 = 01$<br>$T_4 = 1$<br>$T_6 T_5 = 01$<br>$T_8 T_7 = 01$<br>$T_{10} T_9 = 01$<br>$T_{12} T_{11} = 01$ | 1 | 0 | 0/PATTERN GENERATE (RANDOM) | F/COUNT DOWN |
| $T_0 - T_{12} = 1$ | 1 | 0 | 1/PATTERN GENERATE (RANDOM) | 0/COUNT UP |

FIG. 18A3

| WRITE ENABLE REGISTER SEED(HEX)/ CONFIG. | DATA IN/OUT REGISTER SEED(HEX)/ CONFIGURATION | S T 1 | S T 0 | REGISTER F SEED(HEX)/ CONFIG. | NUMBER OF CLOCKS |
|---|---|---|---|---|---|
| 0/PATTERN GENERATE (LOOP) | 0001 IN EACH OF 4 REG'S /PATTERN GENERATE (RANDOM) | 0 | 1 | 0/HOLD | 16 |
| 0/PATTERN GENERATE (LOOP) | 0/X | 1 | 1 | 0/SIGNATURE COLLECTOR | 32 |
| 2A/PATTERN GENERATE (LOOP) | IF---F/HOLD | 0 | 1 | 0/HOLD | 16 |
| 0/PATTERN GENERATE (LOOP) | 0/X | 1 | 1 | 0/SIGNATURE COLLECTOR | 32 |
| 0/PATTERN GENERATE (LOOP) | 0001 IN EACH OF 4 REG'S /PATTERN GENERATE (RANDOM) | 0 | 1 | 0/HOLD | 16 |
| 0/PATTERN GENERATE (LOOP) | 0/X | 1 | 1 | 0/SIGNATURE COLLECTOR | 32 |
| 55/PATTERN GENERATE (LOOP) | IF---F/HOLD | 0 | 1 | 0/HOLD | 16 |
| 0/PATTERN GENERATE (LOOP) | 0/X | 1 | 1 | 0/SIGNATURE COLLECTOR | 32 |
| 0/PATTERN GENERATE (LOOP) | 0/HOLD | 0 | 1 | 0/HOLD | 16 |
| 0/PATTERN GENERATE (LOOP) | 0/X | 1 | 1 | 0/SIGNATURE COLLECTOR | 32 |

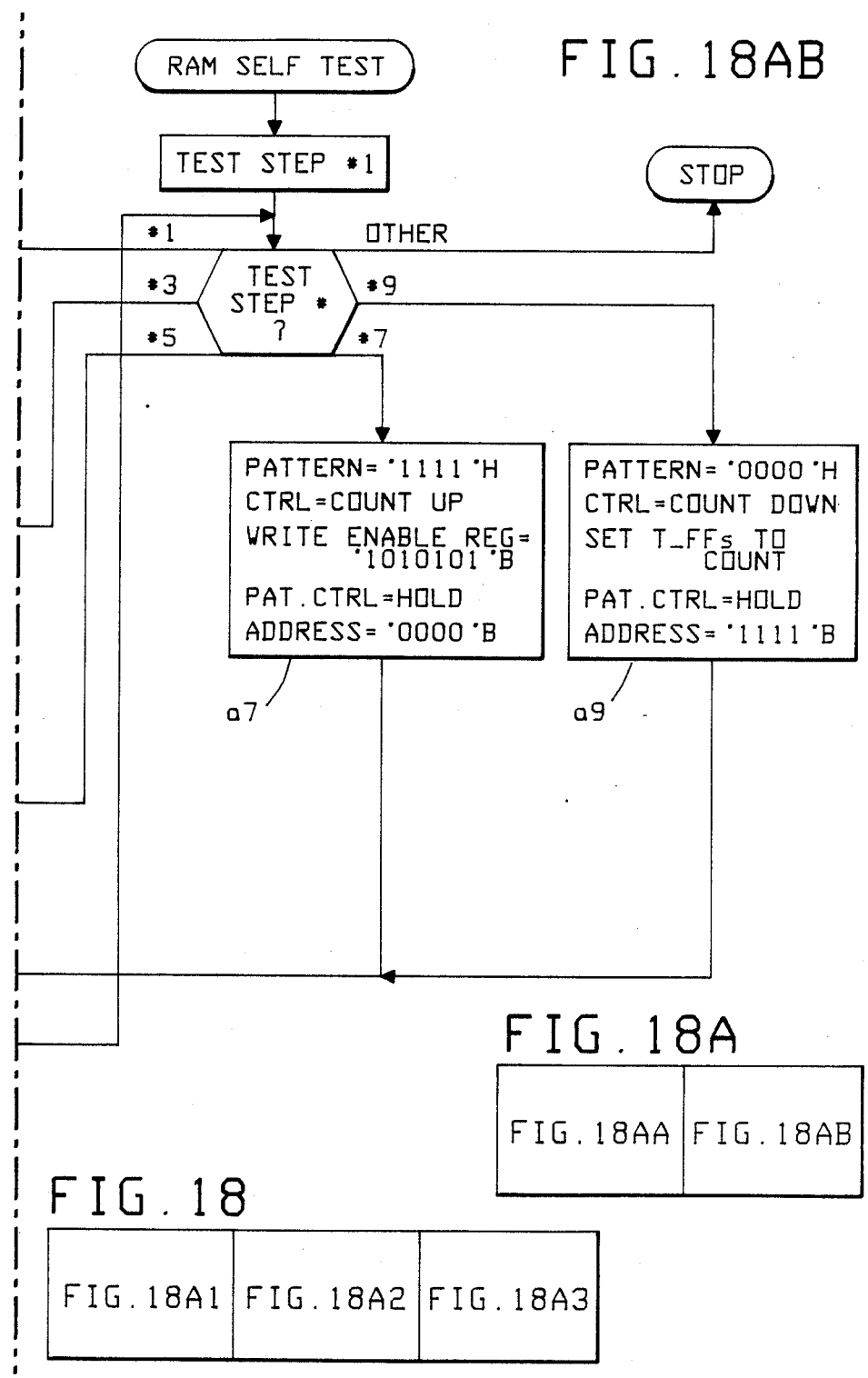

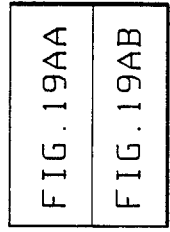
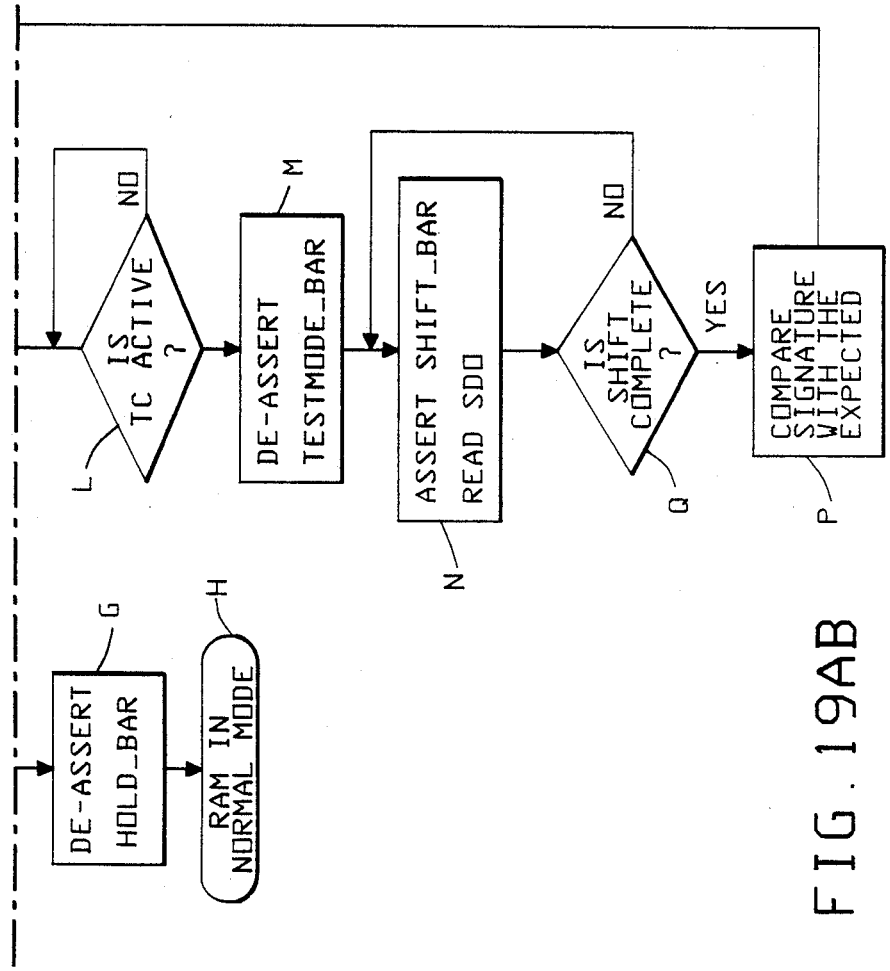
FIG. 19AB

METHOD AND CIRCUITRY FOR ENABLING INTERNAL TEST OPERATIONS IN A VLSI CHIP

FIELD OF THE INVENTION

This disclosure relates to methods for testing gates, logic, memories, etc. within an IC chip without need for externally provided test equipment.

CROSS-REFERENCES TO RELATED APPLICATIONS

This application is related to a co-pending application filed June 12, 1989 as U.S. Pat. Ser. No. 07/364,411 and entitled "Self-Testing Circuitry for VLSI Units" by inventors H. Katircioglu, J. De Beule, and D. Mukherjee.

BACKGROUND OF THE INVENTION

One of the most useful on-chip application specific integrated circuit (ASIC) components is the static RAM, which is employed as local memory, register file and buffers.

To test the RAM cells in VLSI designs, as well as other logic, many different functional and test strategies may be used. D-algorithm (DDrive) is one of the methods commonly used. In fact, the RAM cell used here has the DDriveability feature in it. DDrive is a deterministic test scheme and many vectors have to be generated for a good fault coverage.

Any functional test is not too different in nature from DDrive testing. In either case, a test vector, to check for specific faults, has to be shifted into the RAM snake (all flip-flops are connected to each other as a long shift register), and one clock is applied and the result of the test is shifted out. This procedure is repeated for each test vector generated.

The shift process requires many clocks, considering the quantity of vectors that are generated (about 10,000 vectors for the RAM used here). Manual generation of test vectors for functional testing requires understanding of the functionality of the circuit and is very time-consuming.

No current VLSI design has RAM cells with self-test capabilities. Mostly, functional testing has been used.

The object of this invention is to provide a circuit for a RAM supercell so that the RAM will be self-testable by generating patterns and collecting signatures using flip-flops existing in the RAM cell. Test of the RAM will be possible in a more systematic way and in a much shorter time. Further, only a few test vectors will have to be shifted in.

SUMMARY OF THE INVENTION

A circuit establishing a RAM memory structure is used in a VLSI design which employs built-in self-test (BIST) functions. General requirements for the testability implementation are:

(1) A RAM cell with or without some test capability. The RAM cell used here uses its registers as inputs and outputs for DDrive (a test algorithm) and has two inputs (STO and STI) that provide control signals to the core during test.

(2) All flip-flops used in the RAM cell must have serial data inputs and outputs so that it will be possible to form a long shift register (snake) by connecting them serially. Circuitry is provided to prohibit RAM accesses during a shift operation of the snake.

(3) A set of maintenance operation control signals coming from a maintenance controller:
  A shift control signal
  A shift chain (snake) select signal
  A test mode signal that configures the registers in the chain to generate patterns or collect signatures when testing
  A hold (state freeze signal)

(4) A test clock counter (30, FIG. 3A) and a signal generated by the test clock counter signal TC $30_S$, signaling count termination.

BRIEF DESCRIPTION OF THE DRAWINGS

FIG. 1 is a schematic drawing illustrating an integrated circuit chip with snake structure;

FIG. 2 illustrates a D-type flip-flop;

FIG. 3 illustrates the major system components with FIG. 3A showing the IC chip while

FIG. 6 is a listing of input and output terminals for the RAM cell;

FIG. 9 is a listing of the functions of the control circuitry;

FIG. 18 illustrates an algorithm which can be used for RAM testing.

DESCRIPTION OF THE PREFERRED EMBODIMENT

FIG. 1 shows a generalized diagram of a VLSI chip ($7_S$) that has snake implementation to provide controllability and observability to its states.

SNAKES: All the flip-flops in the chip are connected as a long shift register that may be called a "snake". A maintenance controller (FIG. 3B) can access this snake using serial data input and output pins, thus minimizing maintenance interface requirements. This snake may also be called "chip snake". Snakes provide controllability and observability to the circuit. There may be more than one snake in a chip.

In FIG. 1, as an example, a RAM snake is also shown, which is formed by the flip-flops of the RAM (read register, write register, etc.) as part of the chip snake.

FIG. 2 is the symbol for a D-type flip-flop that has been used in the design. The signals shown are:
CP=clock input
D=data input when TE=0
TI=data input when TE=1
TE=selects between D and TI
Q=true output
Q/=false output Flip-flops 702 of FIG. 7 (T0-T12) used in the preferred design are all of the D-type.

Built-In Self-Test (BIST): As digital circuits grow more complex and difficult to test, it is increasingly attractive to build some self-testing ability into the circuits under test. Built-in self-test (BIST) may be conveniently used to detect and isolate a faulty component in a circuit and to facilitate its replacement.

The built-in test strategy is based on the following principles:

(1) Test patterns are generated on-chip. (pattern generation)

(2) Responses to the test pattern are treated on-chip. (signature collection)

(3) External operations are required only to initialize the built-in tests and to check the results from the chip.

The VLSI circuit, then, will have a test pattern generator, a register that compresses the complete sequence of test responses into a characteristic signature (signature collector), and a functional block that controls the execution of the test.

Figure 3A:
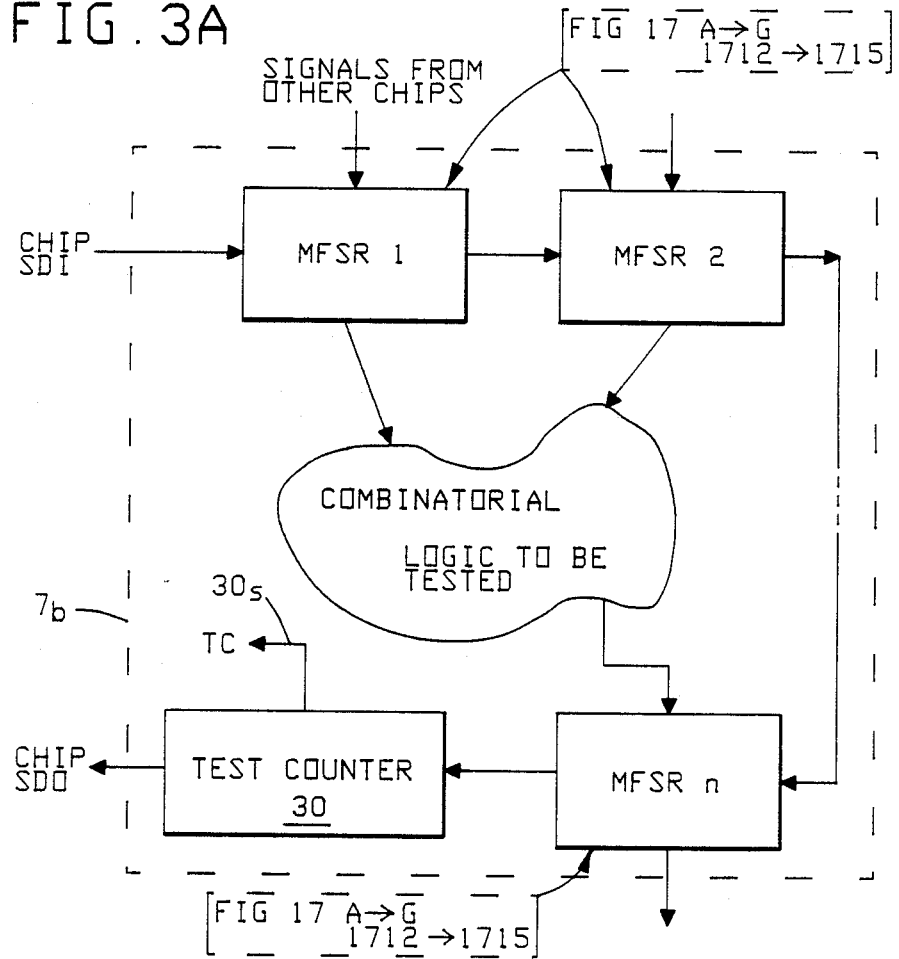

In a chip design, registers may be designed as an MFSR (multiple function shift register) that has both the pattern generation and signature collector functions. The snake is, in this case, formed of MFSRs. An MFSR is basically a maximal length linear feedback shift register (LFSR) which can perform many different operations with simple circuit modifications. Sixteen-bit and 20-bit MFSRs have been practically used. The test counter 30, FIG. 3A, is designed as a simple counter that counts the number of clocks that have to be applied during the test. The test counter block should also be in the snake, for easy initialization.

FIG. 3 shows a chip with a BIST feature. BIST refers to built-in self-test. A possible way to test the combinatorial circuit (such as the RAM core, gates, logic circuitry, etc.) would be:

(1) Initialize the snake such that MFSR1 generates patterns and MFSRn collects the signature, when MFSR2 is holding.

(2) Initialize the snake such that MFSR1 holds; and MFSR2 generates patterns and MFSRn collects the signature.

For each test case, the test counter block 30 is also properly initialized. When the counter reaches its terminal count, TC signal goes active and the test stops. Then, the maintenance controller 10 accesses the snake to analyze the signature to see if there was any failure in the circuit.

Figure 3B:
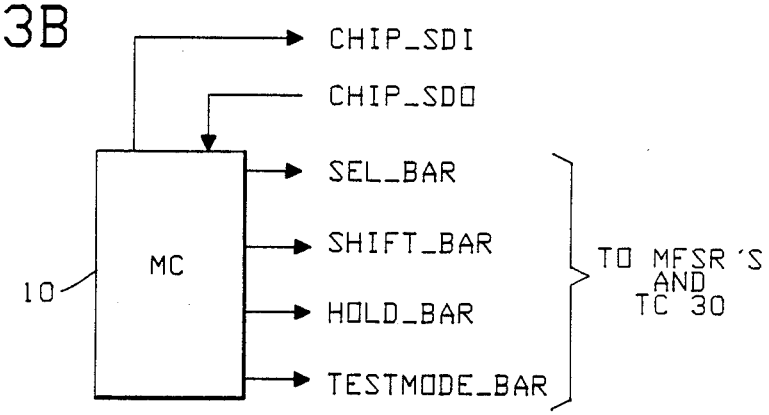
FIG. 3B illustrates the signals to and from the maintenance controller.

In FIG. 3B, the signals that are generated by a maintenance controller 10 are also shown. These include:

CHIP_SDI: It is the serial data input to the chip snake. Data shifted into the snake may be initialization data for normal operations; or the seed for the built-in self-test.

CHIP_SDO: Serial data output of the chip. When there is a shift operation, data in the snake is accepted by the maintenance controller 10, through this output.

SEL_BAR: Selects the snake for a shift operation. Used particularly if there is more than one snake in a chip.

SHIFT_BAR: When active (=0), a shift operation is performed on the snake.

HOLD_BAR: When active (=0), the snake state is held (frozen).

TESTMODE_BAR: When active (=0), a pattern generator generates a new pattern, depending on the seed, at each clock, and the signature collector compresses the responses. For example in FIG. 3A, MFSR 1 and MFSR 2 generate a pattern while the MFSRn becomes the signature collector. Test stops (the snake "holds") when the TC $30_S$ goes active (=1).

—In a design with self-test capability, a MFSR must perform the following functions:

Load Function: The MFSR functions as a parallel load register. All flip-flops in a MFSR are loaded at the same time. Load function is a normal mode operation.

Hold Function: Present state of the MFSR is frozen if a hold function is being performed. No new data is loaded. An MFSR may be held in both normal mode and maintenance mode.

Shift Function: State of a flip-flop is shifted to the next flip-flop stage. Shift function is performed in maintenance mode.

Pattern Generation: An MFSR is used as a pattern generator if its outputs are feeding the inputs of a combinatorial circuit as in FIG. 3A. An MFSR can generate looping (walking) patterns or random patterns (all possible non-zero combinations). Pattern generation is a maintenance mode function.

The length of an MFSR is very important as far as test execution duration. If the MFSR is to generate random patterns, it generates all possible non-zero bit combinations. It generates $(2^N-1)$ patterns where N=the number of bits in each MFSR. Sixteen-bit MFSRs have been accepted as a standard, which needs (65,536-1) clocks to perform an exhaustive testing. If the MFSR is to generate walking (loop) patterns only, then there is no length limitation.

To do all the functions specified above, an MFSR needs two function-control flip-flops. In this design, totally 14 flip-flops have been added for control functions. Thirteen of them are called T flip-flops (T0-T12) and the other is called Test-Gen FF. Test-Gen flip-flop (1020, FIG. 10 which is the item 706 of FIG. 7) is attached to the 4-bit Read Address Register of the RAM cell, so that 4-bit all zeros pattern will also be generated (also refer to FIG. 10).

In this system, all the RAM cell flip-flops (518–521, FIG. 7) have been connected to form MFSRs. For the MFSRs to perform the required function, the maintenance signals are used as follows:

(a) Normal Mode: No maintenance interface signal is active. All the MFSRs are in parallel load mode. The RAM always "reads". If the Write Enable Register (FIG. 12) contains an active bit, then it "writes".

(b) Maintenance Mode: In maintenance mode, HOLD_BAR signal (FIG. 3B) is always active. Other signals may be activated depending on the function to be performed.

(c) Hold Operation: HOLD_BAR is active (=0); all other maintenance signals are inactive (=1). All flip-flops hold.

(d) Shift Operation: HOLD_BAR=0, SHIFT_BAR=0, SEL_BAR=0. The shift operation overrides the hold. The reason for keeping HOLD_BAR active throughout the shift operation is that in case the shift cannot be done continuously (may be done 8-bits at a time), states of the snakes must be held between shifts.

(e) Pattern Generation: HOLD_BAR=0, TESTMODE_BAR=0. Before TESTMODE_BAR is activated, proper control bits and seed must be set in the T flip-flops 702, FIG. 7, and the MFSR, and in the test counter 30, FIG. 3A through a shift-in operation.

When the TESTMODE_BAR is activated, T flip-flops 702 continue to hold and the MFSR generates a new pattern at each clock. When signal TC $30_S$ goes active, pattern generation stops and the snake goes into hold mode, although TESTMODE_BAR is kept active. It may be noted that even a counter may be used as a pattern generator. In this case, counting starts when TESTMODE_BAR goes active and it stops when TC $30_S$ goes active.

(f) Signature Collection: HOLD_BAR=0, TESTMODE_BAR=0. Before TESTMODE_BAR is activated, proper configuration bits and seed must be set in the T flip-flops 702, the MFSR (518-521) and in the Test Control Counter (30, FIG. 3A), through a shift-in operation.

At each clock, the data on the parallel inputs of the MFSR (518-521) are EXORed with the outputs of the flip-flops in previous stages and shifted one bit. This way the data is compressed to form a signature. Signature collection stops when TC goes active. When TC goes active, the maintenance controller 10 does a shift-out operation to get the signature and analyze it. The parallel inputs of the MFSR (518-521) in this case must be the outputs of the circuit under test. If the signature obtained from the circuit is different from the one that was obtained originally on the good circuit (for example, obtained by simulation) with the same patterns, then the circuit under test is defective.

Figure 4:
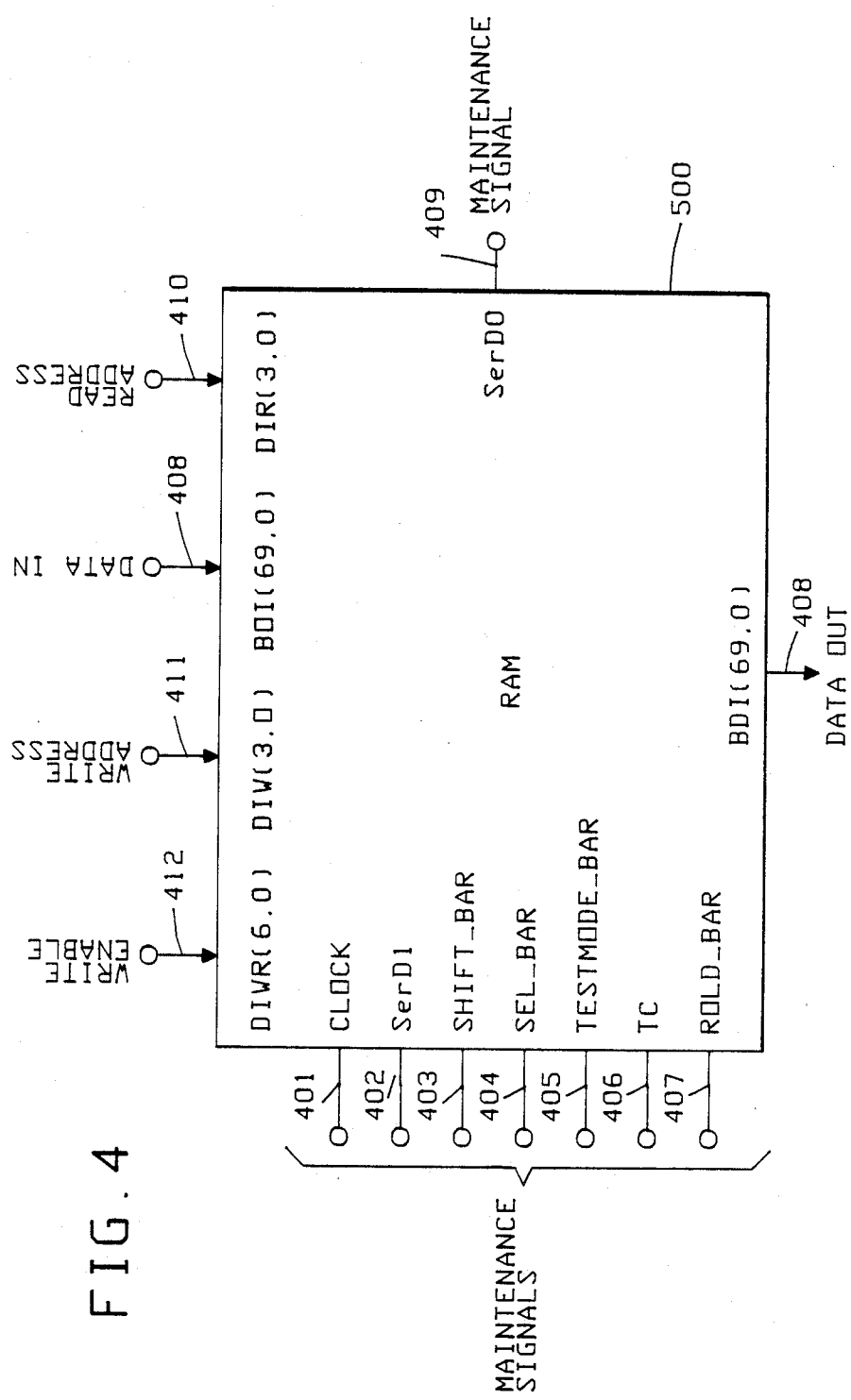
FIG. 4 is a drawing showing inputs and output to a RAM cell.

FIG. 4 shows a schematic circuit generated for this system. The RAM cell used and the circuit designed around it (to make it self-testable) is represented by the schematic circuit.

OPERATIONAL SIGNALS: (Inputs to RAM cell in FIG. 4)
DIWR(6:0) Write Enable Register inputs. (412)
DIW(3:0) Write Address Register inputs (411)
DIR(3:0) Read Address Register inputs. (410)
BDI(59:0) Data In/Out Register inputs and outputs (408).

MAINTENANCE OPERATION CONTROL SIGNALS: (FIG. 4 reference)

SEL_BAR (404) When active, the RAM snake is selected for shift operation. The RAM snake 700 consists of registers 518-522 plus the T-flip-flops 702 (T0-T12).

SHIFT_BAR: (403) When active, the RAM snake (all the flip-flops in the disclosed circuit and the RAM registers are connected as shift register) are put into shift mode. If the RAM snake is part of a chip snake, then the entire snake has to be in shift mode. The chip snake $70_S$ consists (FIG. 17) of the entire path of registers from SDI 1717 to SDO 1718. HOLD_BAR must be active between shifts; therefore HOLD_BAR might be kept active all the time except when the RAM is in normal mode.

SerDI: (402) Serial data input for the RAM snake. If the RAM snake is part of a chip snake, then SDI is the serial data input of the part of the chip snake before the RAM snake.

CLOCK: (401) Clock input.

HOLD_BAR: (407) When active, it shows the RAM is in maintenance mode. When HOLD_BAR is active (=0) and SHIFT_BAR not active, all the registers are put into hold mode. Note SCAN is also active when HOLD_BAR is active.

TESTMODE_BAR: (405) When active, with HOLD_BAR active, the RAM 500 registers are configured to perform one of the maintenance functions (hold, pattern generation or signature collection), depending on the states of the T flip-flops 702. Test mode of the circuit continues until test clock counter 30, FIG. 3 stops counting (that is, TC goes active).

TC: (406) Terminal count. It is the output of a counter 30 in the chip that counts the number of clocks to be applied when TESTMODE_BAR is active. When the counter reaches its terminal count, TC goes active and the RAM snake is put into hold mode.

SerDO: (409) Serial Data output 409 for the RAM snake. If the RAM snake is part of a chip snake, then SDO is the serial data input of the part of the chip snake after the RAM snake.

Figure 5:
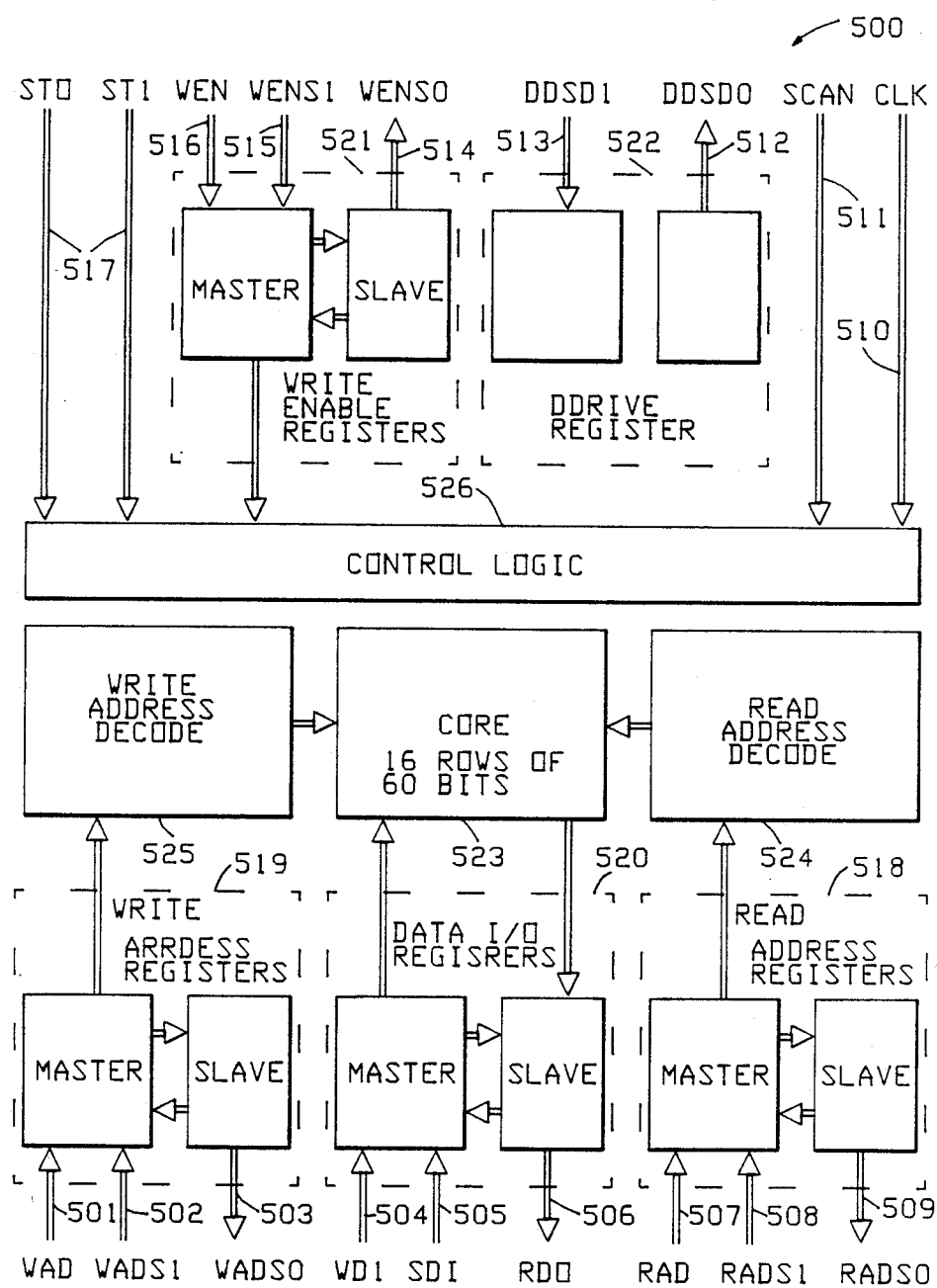
FIG. 5 is a block diagram of a RAM cell.

FIG. 5 shows the block diagram of the 16×60 RAM cell used in the design. The description of the input and output pins are given in FIG. 6.

The RAM 500, FIG. 5, is composed of nine major functional components: Read Address Register 518, Write Address Register 519, Data Register 520, Write Enable Register 521, DDrive Register 522, RAM Core 523, Read Address Decode 524, Write Address Decode 525 and Control Logic Block 526, respectively.

All the registers are designed to function as latches in the normal mode of operation and as flip-flops in the shift mode (SCAN=1) of the RAM cell 500.

The RAM "core" 523, FIG. 5 is a static memory array with independent storage (write) and access (read) paths, and a capacity of sixteen-60 bit words (6 bytes with parity +5-bit tag with parity). Each byte or the tag field may be written individually along with the associated parity bit, using the Write Enable Registers 521.

The Control Logic Block 526, FIG. 5, determines which of the many data-transfer paths is active during any of the various modes of operation. The Control Logic Block 526 is the block that "prohibits" RAM core accesses when there is a snake shift operation (SCAN=1).

MODES OF OPERATION:

(a) Normal Mode: The shift control signal and test control signals must be inactive (SCAN=0 and STO,-STI=00). Normal read and write functions are performed. Input bus levels are loaded to the registers and the RAM cores is accessed.

(b) Shift Mode: The shift control signal must be active (SCAN=1) and test control signals must be STO,-STI=00. Serial data input levels are loaded to the registers 518-521, 702. RAM core is not accessed.

(c) Test Mode: In the DDrive testing mode, the registers and the RAM core 523 are tested. STO and STI inputs (FIG. 5) may be used to provide self-test compatibility to the RAM cell 500, although these inputs are not required on a RAM cell that can be used in conjunction with this system.

On the RAM cell used here: If SCAN=1 STO, STI=10, then serial data is loaded to the Write Address Register 519, FIG. 5 and the Data Register 520. The contents of the Data Register 520 are written to the location addressed by the contents of the Write Address Register 519 without a need for the Write Enable Register 521.

If SCAN=1 STO, STI=01, serial data in FIG. 5 is loaded to the Write Address Register 519 and the Data Register 520. The Write Enable Register 521 must have been loaded with "1's" in respective byte locations in a previous shift operation, if a Write operation is required. The bytes in the Data Register 520 corresponding to the "1" bits in the Write Enable Register 521 are written to the location addressed by the Write Address Register 519. If the Write Enable Register 521 contains all "zeros", no Write operation takes place.

If SCAN=1 STO,STI=11, serial data is loaded to the Read Address Register 518 and the contents of the location addressed by the Read Address Register 518 is read out.

Figure 7:
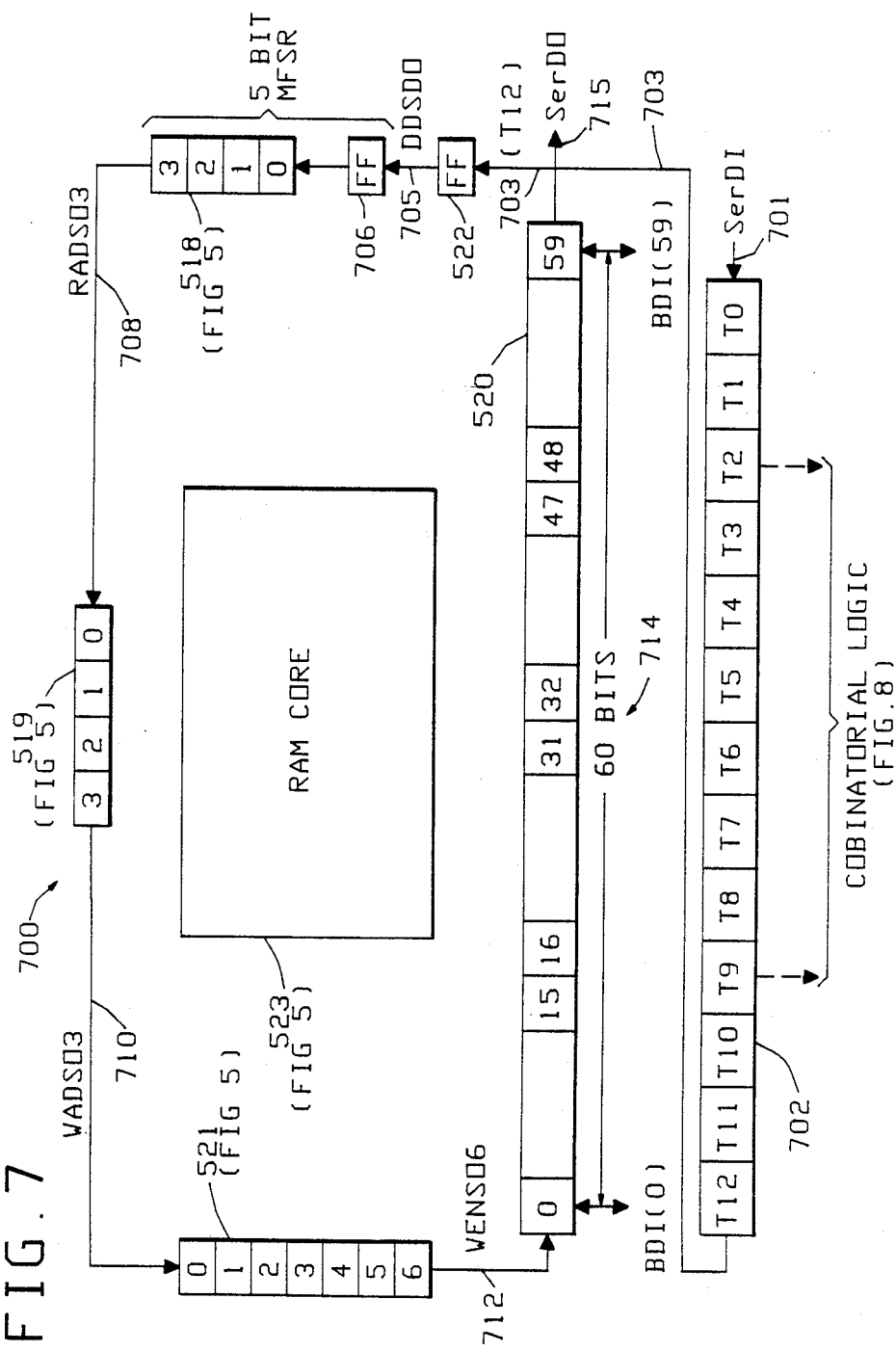
FIG. 7 is a diagram showing the RAM registers and T registers connected to form a RAM snake.

The circuitry provided in this system is used to add self-test capability to the RAM cell 500. To provide controllability and observability, the registers as seen in FIG. 7, are connected to each other to form the "RAM snake" (702, 522, 706, 518, 519, 521, 520 (FIGS. 7,17)). Combinatorial circuits, FIGS. 10–16 of multiplexers and gates are added at the input of each flip-flop (register) so the input signals may be determined for different operations.

In "test mode", registers 518, 519, 521, 520 in FIG. 7 function as a pattern generator or a signature collector (if they are not in hold mode). Thirteen (13) more flip-flops (T flip-flops 702, FIG. 7) are added to the RAM snake 522, 706, 518, 519, 521, 520 in FIG. 7 so that the registers may be configured to perform different operations (hold, pattern generate, signature collect). Lastly, a combination circuit is provided to decode the signals that come from a maintenance controller 10 and to generate the control signals to put the circuit in the different modes of operation.

FIG. 7 shows all the RAM registers (518–522, FIG. 5); and the T flip-flops 702 connected to each other to form the RAM snake 700.

The signal SerDI (701) FIG. 7 is the serial data input to the system. The level at the SerDI (701) input is propagated through the T flip-flops (702), the DDrive FF (522), Test Gen. FF (706), Read Address Register (518, FIGS. 5 and 7), Write Address Register (519), the Write Enable Register (521), Data In/Out Register (520), and to the SerDO (715) which is the serial data output.

The shift chain between the SerDI (701) and SerDO (715) is called the "RAM snake" 700. To properly initialize the RAM for test purposes or normal operations, the serial path is used. After initialization, the required operations may be performed on the RAM core (523, FIG. 5).

Figure 8A:
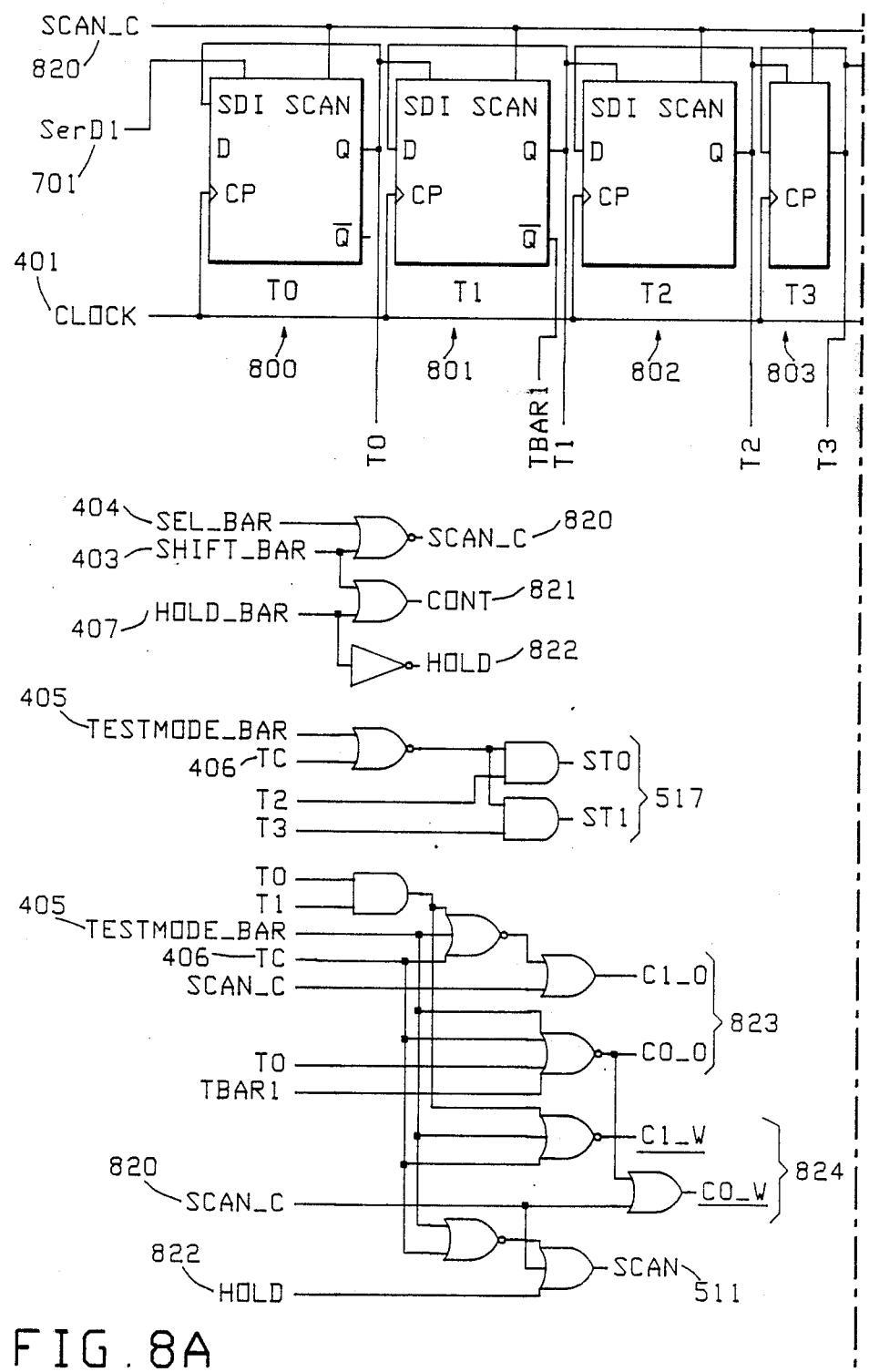
FIG. 8 is a diagram of the control circuitry for controlling operational modes of a RAM.

FIG. 8 shows the circuitry that controls the modes of operation on the RAM, 500.

The 13 flip-flops (T0–T12) of 702, FIG. 7 are used to configure the RAM registers (518–522) to perform a particular test function. They are in either "shift" mode or "hold" mode. There are no parallel data inputs to them. They are used for maintenance functions only.

The flip-flops (T0–T12) are connected to the RAM registers serially; hence the T flip-flops 702 are part of the RAM snake 700. The RAM snake may be part of a long snake in the chip.

The maintenance signals are decoded in combination with the T flip-flop outputs in the FIG. 7 combinatorial logic (FIG. 8, 800–812) shown to generate: the (SCAN-C and Scan) shift control signals; STO and STI self-test mode signals; Hold control signal; and C multiplexer select control signals.

The detailed operation of the control circuit of FIG. 8 is described in FIG. 9 as a function table.

Referring to FIGS. 8 and 9, SEL_BAR (404), SHIFT_BAR (403), HOLD_BAR (407), TESTMODE_BAR (405), and SerDI (701) are the maintenance signals generated by the maintenance controller 10, as indicated in FIG. 4. TC line 30$_S$ (406 of FIG. 8) is also indicated in FIG. 4, but it is generated in the chip by the test counter block 30. All other signals are generated in FIG. 8.

In "normal" operations mode, SHIFT_BAR (403), HOLD_BAR (407) and TESTMODE_BAR (405) are inactive (=1). The SCAN_C (820) signal will be "0", hence T flip-flops 702 (T0–T12) (800–812 of FIG. 8) will be "holding". For normal operation, the T flip-flops may contain all zeros, as initialized with a shift operation by the maintenance controller 10.

In "normal" operation mode, all combinatorial logic outputs shown in FIG. 8 are "0" except the CONT (821) signal which is a "1".

In "shift" mode: SEL_BAR (404)=0, SHIFT_BAR (403)=0. HOLD_BAR (0407)=0, TESTMODE_BAR (405)=0. SCAN_C (820) becomes a "1", so T flip-flops T0–T12 (800–812, FIG. 8) are all in "shift mode". The level on line SerDI (701) is shifted in and propagated through the T flip-flops. The output T12 (703) of the T flip-flop T12 (FIG. 8, 812) becomes the serial data input to the DD flip-flop (704) as shown in FIG. 7.

In the shift mode, the SCAN (511, FIG. 8) signal is active (=1) so the registers embedded in the RAM cell may select the serial data inputs, and the CONT (821) signal is "0" so all the registers in the RAM snake may be connected to each other serially. The multiplexer control signals CO_0, Cl_0; CO_W, Cl_W; CO_1, Cl_1; CO_2, Cl_2; CO_3, Cl_3; CO_4, Cl_4 (823–828) are all "10" so that the serial path between flip-flops in the RAM cell is complete.

In the "hold" mode of FIG. 8, SHIFT_BAR (403)=1, HOLD_BAR (407)=0 and TESTMODE_BAR (405)=1. On the combinatorial circuit, CONT (Control) (821) signal is "1" and the SCAN (511) signal is "1". All other outputs are "0".

In the "test" mode of FIG. 8, SHIFT_BAR (403)=1, HOLD_BAR (407)=0, and TESTMODE_BAR (405)=0. SCAN (511) signal is "1" and T flip-flops hold. ST1, ST0 (517) is a function of T2 and T3, (802) and (803) flip-flops respectively. Cl_0, CO_1, Cl_W, CO_W are a function of T0 and T1, (800) and (801) flip-flops respectively. Cl_1, CO_1 are a function of T5 and T6, (805) and (806) flip-flops respectively. Cl_2, CO_2 are a function of T7 and T8, (807) and (808) flip-flops respectively. Cl_3, CO_3 are a function of T9 and T10, (809) and (810) flip-flops respectively. Cl_4, CO_4 are a function of T11 and T12, (811) and (812) flip-flops respectively. T flip-flops are all in hold mode. The test mode functions of the RAM registers 518–521 depend on the states of the T flip-flops 702.

Figure 10B:
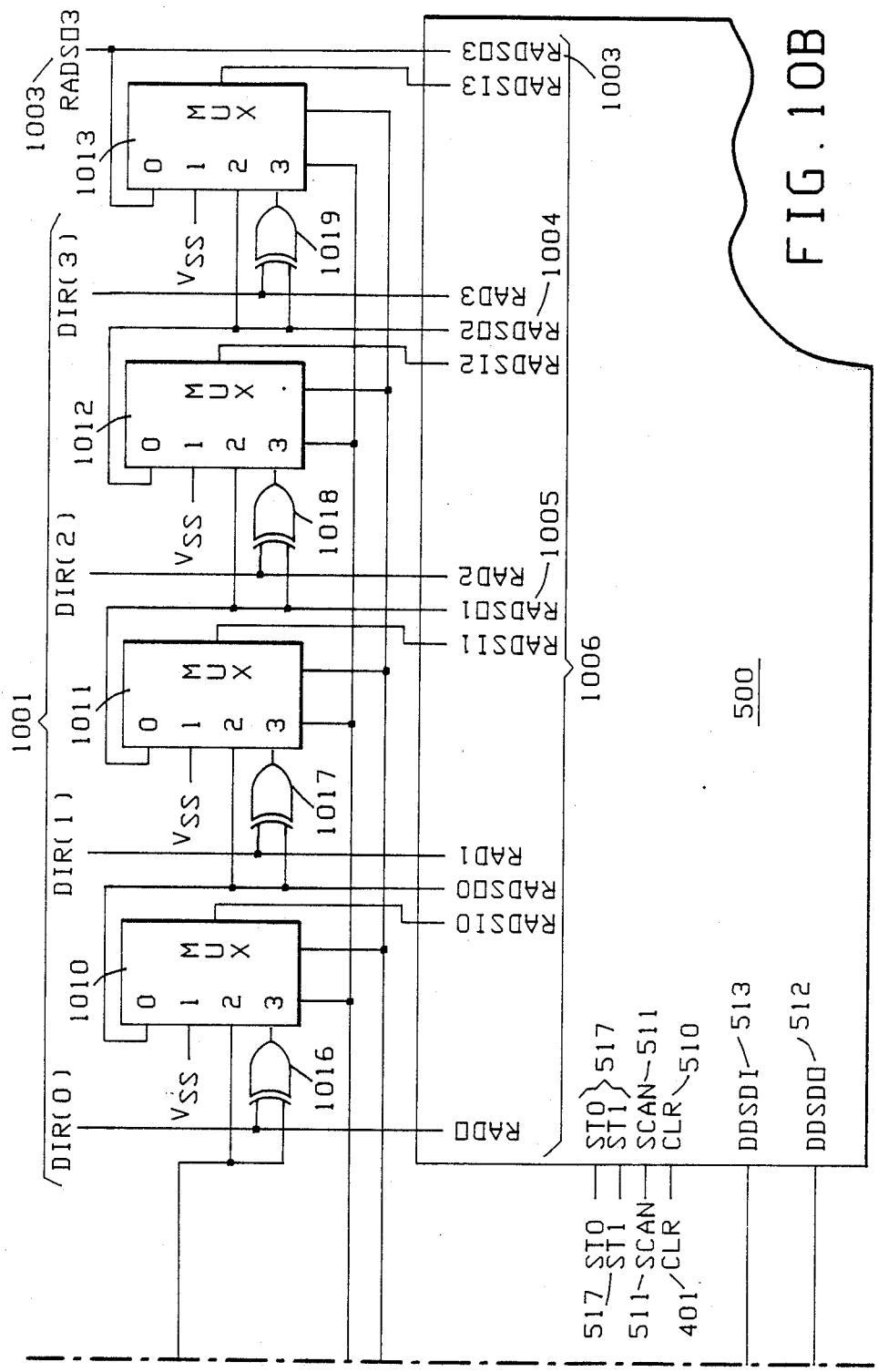
FIG. 10 is a diagram of the Read Address Register in the RAM cell.

FIG. 10 shows the Read Address Register (518, FIG. 5) connection in the RAM cell 500 from the disclosed circuitry. These connections are RAD0, RADSI0, RADSO0 - RAD3, RADSI3, RADSO3 shown with reference number (1006). It also shows DDrive flip-flop connections DDSDI (513) and DDSDO (512).

In the normal mode of FIG. 10, SCAN (511)=0 and CONT (821)=1. The input 1 of the multiplexer (1007)

will be selected, which connects the DDSDO (512) output of the DDrive flip-flop to DDSDI (513) input. Therefore, the DDrive flip-flop will be holding.

Since Cl_0, CO_0 (823 in FIG. 10) signals are "00", the input 0 of the multiplexer (1009) is selected, which means that the Test Gen flip-flop (1009 which is 706 of FIG. 7) will be holding. Since SCAN (511)=0, and STI, STO (517)=00, the RAM cell 500 will be in normal mode. Therefore, the address information DIR(-0)–DIR(3) (1001) is loaded to the Read Address Register 518 embedded in the RAM cell (500) through inputs RAD0–RAD3 in (1006).

In the shift mode of FIG. 10, SCAN (511)=1, CONT (821)=0, and Cl_0, CO_0 (823)=10. On the multiplexer (1007), the input 0 is selected. This input is T12 (703) which is the output of the last stage (812) in the T flip-flops shown in FIG. 8. That input is loaded to the DDrive flip-flop (522 of FIG. 7) through the input DDSDI (513) with the clock (510) and it becomes available at the output DDSDO (512). In the next clock, shifting will continue through the input 0 of the multiplexer (1008) and the input 2 of the multiplexer (1009) and to the output of the Test Gen FF (1020) which is 522 of FIG. 7. In the subsequent clock, serial data will be shifted through the input 2 of the multiplexers (1010–1013) and RADSI0–RADSI3; inputs and RADSO0–RADSO3 outputs of the Read Address Register, 518.

Since SCAN (511)=1, the RAD0–RAD3 inputs have no effect on the RAM cell, 500.

In the hold modes, SCAN (511)=1, CONT (821)=1 and Cl_0, CO_0 (823)=00.

Since CONT (821)=1, the input 1 on the multiplexer (1007) is selected and the output of the DDrive flip-flop (522, FIG. 7) is connected to its input. Therefore, the DDrive flip-flop will be holding. Since Cl_0, CO_0 (823)=00, the input 0 of the multiplexers (1009–1013) will be selected. Therefore, Test Gen flip-flop (1020 of FIG. 10; 706 of FIG. 7) will be holding; and the flip-flops in the Read Address Register 518 of the RAM cell 500 will be holding through their outputs 1005, 1004, 1003 (RADSO1–RADSO3) and serial data inputs (RADSI0–RADSI3).

Since SCAN 511=1, the parallel data inputs RAD-0–RAD3 are not effective on the RAM cell, 500.

In the test mode, SCAN 511=1, CONT 821=1. The Read Address Register 518 functions depending on the states of T0 and T1 flip-flops, as shown below in Table I.

TABLE I

| TC | T1 | T0 | CL_O | CO_O | FUNCTION |
|---|---|---|---|---|---|
| 0 | 0 | 0 | 0 | 1 | Not Valid |
| 0 | 0 | 1 | 1 | 0 | The Read Address Register functions as a pattern generator. As a 5-bit MFSR, all possible patterns are generated, but the patterns on the 4-bits of the Read Address Register includes all zeros. The primitive polynomial used for the MFSR is: $1 + X^2 + X^5$ |
| 0 | 1 | 0 | 1 | 1 | The Read Address Register collects signature as a 16-bit MFSR in conjunction with the Write Address |

TABLE I-continued

| TC | T1 | T0 | CL_O | CO_O | FUNCTION |
|---|---|---|---|---|---|
|   |   |   |   |   | Register and Write Enable Register. The primitive polynomial used for the MFSR is: $1 + X + X^3 + X^{12} + X^{16}$ |
| 0 | 1 | 1 | 0 | 0 | Hold |
| 1 | X | X | 0 | 0 | Hold |

In the test mode, since CONT (821) signal is "1", the DDrive flip-flop with input DDSDI (513) and output DDSDO (512), embedded in the RAM cell (500) is in the hold mode.

Figure 11:
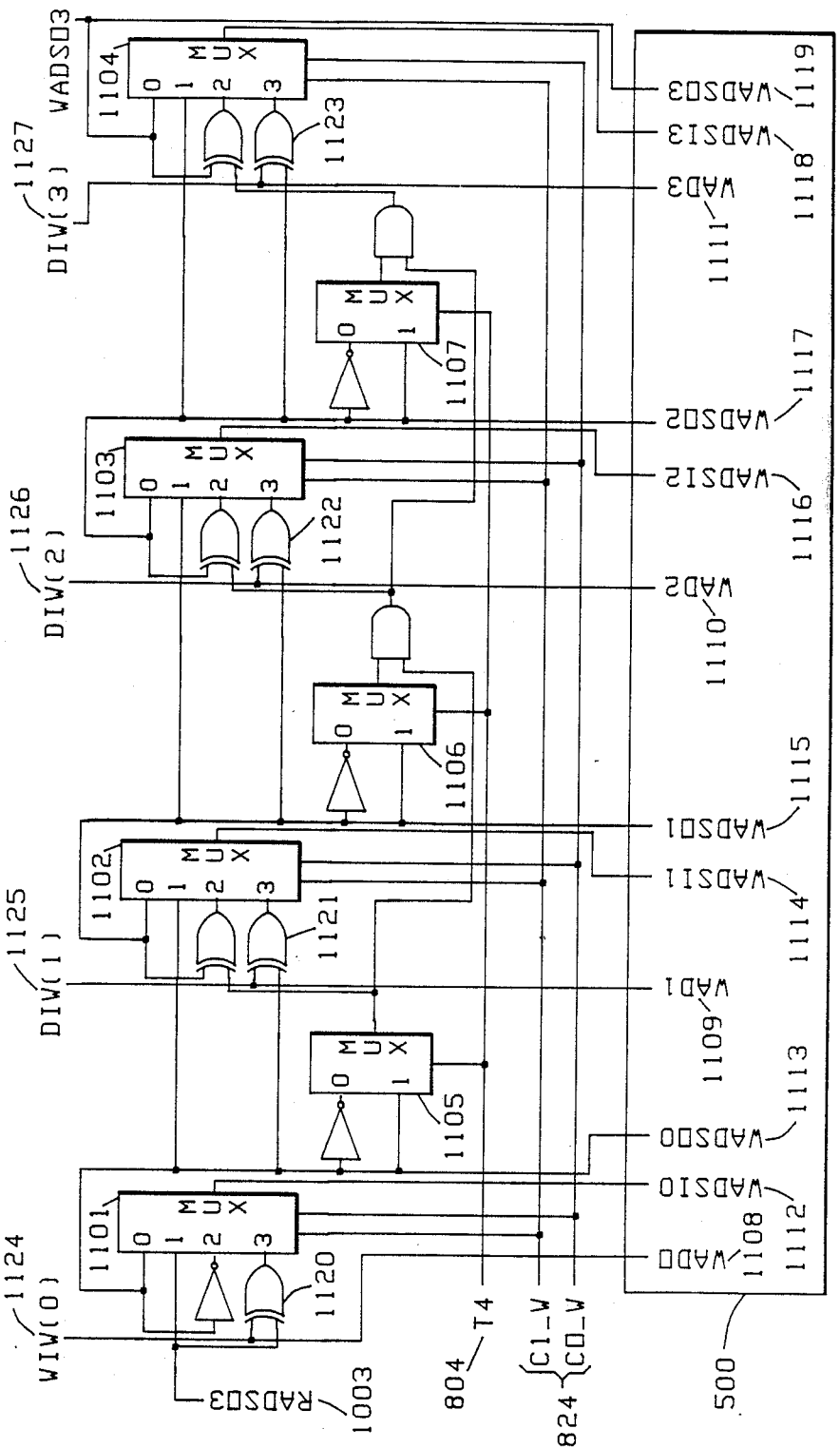
FIG. 11 is a diagram of the Write Address Register.

FIG. 11 is the Write Address Register 519, FIG. 5, that provides a 4-bit write address to the RAM cell 500.

In the normal mode of FIG. 11, address information DIW(0)–DIW(3) (1124–1127) is loaded to the Write Address Register 519 in parallel through the WAD-0–WAD3 (1108–1111) inputs. In the normal mode, the parallel load inputs WAD0–WAD3 are automatically selected on the RAM cell since SCAN=0.

For any other mode of operation, serial data inputs and outputs WADSI0–WADSI3 and WAD-SO0–WADSO3 (1112–1119) are selected, on the RAM cell 500, since SCAN goes to "1" when HOLD_BAR or SHIFT_BAR is active.

In the shift mode of FIG. 11, CL_W, CO_W (824)=01. Therefore, the input 1 of the multiplexers 1101-1104 are selected; and RADSO3 (1003) signal, which is the output from the Read Address Register 518 of FIG. 10, is shifted into the Write Address Register 519 through the multiplexers (1101-1104); and the serial data inputs WADSI0–WADSI3 and the serial data outputs WADSO0–WADSO3 (1112–1119) of the flip-flops embedded in the RAM cell 500.

In the "hold" mode of FIG. 11, CL_W, CO_W (824)=00. Therefore, the outputs WADSO0–WAD-SO3 (1113, 1115, 1117, 1119) are fed back to their inputs WADSI0–WADSI3 (1112, 1114, 1116, 1118) through the "0" inputs of the multiplexers (1101–1104); hence holding their states.

In the "test mode" in FIG. 11, T4 (804) may have either a "0" or "1". CL_W, CO_W will be a function of T1, T0 flip-flops. Then the Write Address Register 519 may generate patterns as a "counter 519", FIG. 7, or it may collect signatures.

When the flip-flops 702 of T1, T0=01, CL_W, CO_W are "10", then the Write Address Register 519 will be counting (up if T4=1, down if T4=0) as a 4-bit binary counter. When counting, the multiplexer (1101) determines the least significant bit and the multiplexer (1104) determines the most significant bit of the counter.

When T1, T0=10, CL_W, CO_W (824 of FIG. 11) are "11", then the Write Address Register 519 will be collecting "signatures" as a 16-bit MFSR (multifunction shift register) in conjunction with the Read Address Register 518 and the Write Enable Register 521. In signature collection mode, input 3 (1120–1123) is selected on the multiplexers (1101–1104) and parallel inputs (1124–1127) are EXORed with the outputs of the flip-flops in the previous stages, by the EXOR gates (1120–1123).

When T1, T0=11, CL_W, CO_W are "00", then the Write Address Register 519 will be "holding".

The summary of the operation in "test" mode is given below in Table II.

TABLE II

| TC | T1 | T0 | Cl_W | CO_W | FUNCTION |
|---|---|---|---|---|---|
| 0 | 0 | 0 | | | Not valid |
| 0 | 0 | 1 | 1 | 0 | Pattern generation counting T4 = 0 count down T4 = 1 count up |
| 0 | 1 | 0 | 1 | 1 | Signature collection. The Write Address Register collects signature as a 16-bit MDFSR in conjunction with the Read Address Register and Write Enable Register |
| 0 | 1 | 1 | 0 | 0 | Hold |
| 1 | X | X | 0 | 0 | Hold |

Figure 12:
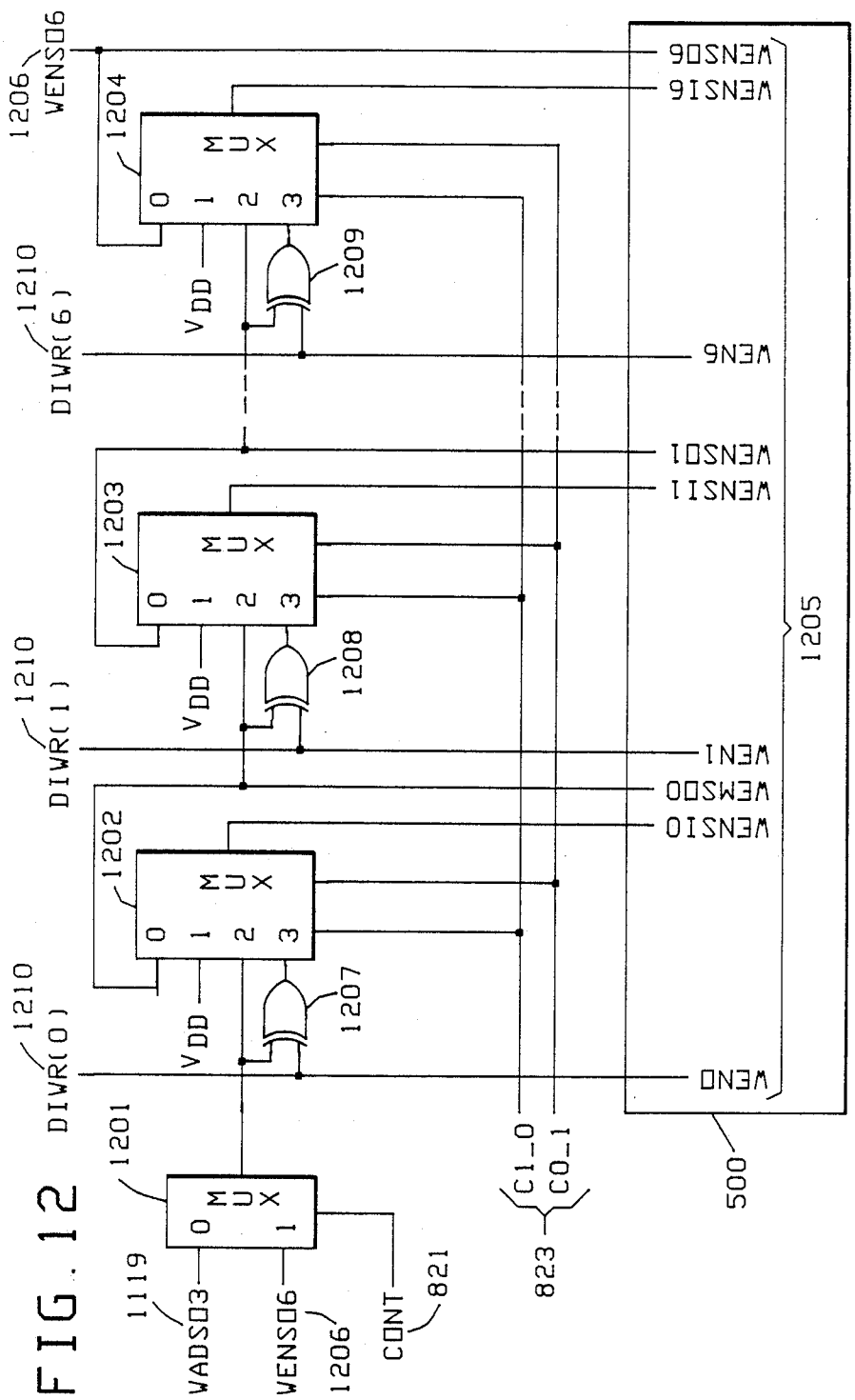
FIG. 12 is a diagram of the Write Enable Register.

FIG. 12 is the 7-bit Write Enable Register 521 by which six bytes of data with parity (and the tag field with parity) in the RAM cell 500 may be selectively written to.

In the "normal" mode in FIG. 12, the Write Enable Register 521 is a parallel load register like other registers in the RAM cell 500. The levels at the parallel inputs DIWR(0)-DIWR(6) (1210) of FIG. 12 are loaded to the register through the inputs WEN-0-WEN6 (1205). For any other mode of operation, the serial data inputs WENSI0-WENSI6 and serial data outputs WENSO0-WENSO6 (1205) are selected, when HOLD_BAR is active.

In the normal mode in FIG. 12, SHIFT_BAR, HOLD_BAR and TESTMODE_BAR are all inactive and hence SCAN input on the RAM cell is inactive. Therefore, the RAM 500 goes into normal mode and parallel data inputs WEN0-WEN6 are used to load information to the registers.

In the "shift" mode, CONT (821)=1, Cl_0, CO_0 (823)=10. Therefore, the input 0 on the multiplexer (1201) and input 2 on the multiplexers (1202-1204) are selected. The last stage of the Write Address Register 519, WADSO3 (1119) is shifted into WENSI0 (1205) through the multiplexers (1201 and 1202) to the WENSO0 (1205) output of the first flip-flop in the register, and shifting continues through the multiplexers (1203, 1204) and all the flip-flops in the Write Enable Register 521 to the WENSO6 (1206) output.

In the hold mode of FIG. 12, Cl_W, CO_W=00. Therefore WENSO (1205) outputs of the register flip-flops are fed to the "0" inputs of the multiplexers (1202-1204) and then to the WENSI (1205) inputs of the flip-flops, hence the states of the flip-flops are held.

In the test mode of FIG. 12, CONT (821)=1; Cl_W, CO_W=10 if T1, T0=01; Cl_W, CO_W=11, if T1, T0=10.

If T1, T0 flip-flops are 01, then the Write Enable Register 521 generates walking patterns. The output WENSO6 (1206) is wrapped around to the "1" input of the multiplexer (1201) and the state is shifted in the register.

If T1, T0 flip-flops are 10, then the Write Enable Register 521 will collect signatures in conjunction with the Read Address Register 518 and Write Address Register 519 as a 16-bit MFSR. The inputs DIWR(0)-DIWR(6) (1210) are EXORed with the outputs of the flip-flops in the previous stages; and are fed into the "3" inputs of the multiplexers (1202-1204) and the WENSI inputs of the flip-flops. At each clock, the signature is compressed in the register (521 Write Enable Register).

The circuit operation is summarized below, for the test mode, in Table III.

TABLE III

| TC | T1 | T0 | Cl_O | CO_O | FUNCTION |
|---|---|---|---|---|---|
| 0 | 0 | 0 | | | Not valid |
| 0 | 0 | 1 | 1 | 0 | Pattern generation: Walking bit patterns are generated by the Write Enable Register 521 since WENSO6 is wrapped around (CONT = 1). |
| 0 | 1 | 0 | 1 | 1 | Signature collection. The Write Enable Register collects signature as a 16-bit MFSR in conjunction with the Read Address Register and Write Address Register |
| 0 | 1 | 1 | 0 | 0 | Hold |
| 1 | X | X | 0 | 0 | Hold |

Figure 13:
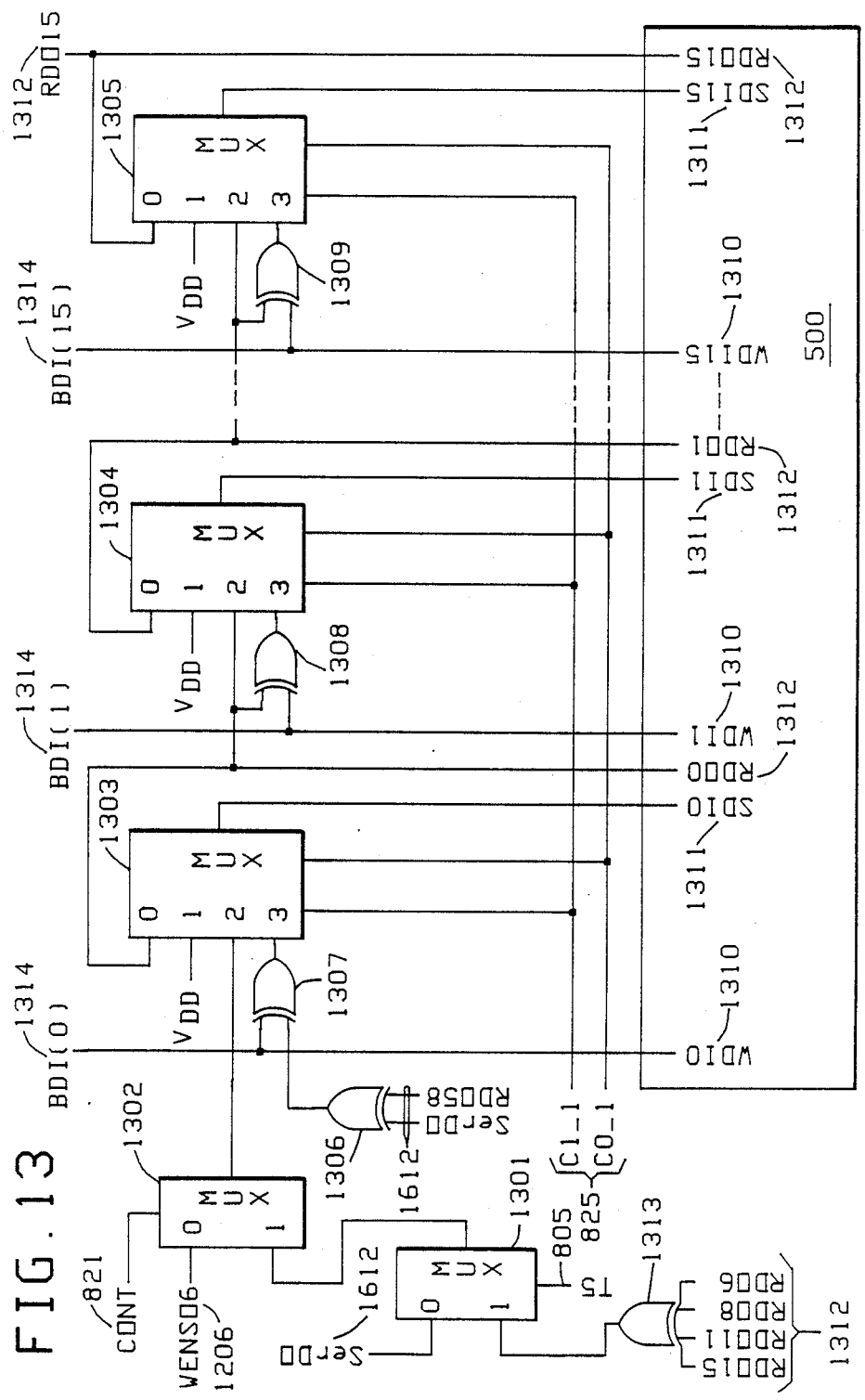
FIG. 13 is the circuitry holding the first 16-bit slice of the 60-bit Data In/Out Register of the RAM cell.

In FIG. 13, it may be noted that the 60-bit Data In/Out Register (520) of FIG. 7 has been split to three 16-bit and one 12-bit slices with FIG. 13 showing the first slice. In the normal mode, the Data I/O Register 520 functions as a 60-bit parallel load register. If the HOLD_BAR is the only maintenance signal that is active, all 60 bits are frozen. To collect signatures and to generate walking (looping) patterns in test mode, all four slices must be configured to form a 60-bit circuit. For random pattern generation and hold functions in test mode, each of the four slices may be configured individually.

FIG. 13 is the first 16-bit slice of the 60-bit Data In/Out Register of the RAM cell 500. In the normal mode, all the maintenance signals are inactive, and SCAN input on the RAM cell is inactive ("0"). Therefore, parallel inputs WDI0-WDI15 (1310) are selected and parallel data BDI(0) and BDI(15) (1314) are loaded in parallel to the Data In/Out Register bits 0-15.

For all other modes of operation, serial data inputs SDI0-SDI15 (1311) and serial data outputs RDO0-RDO15 (1312) are used, since SCAN will be active ("1") when HOLD_BAR is active ("0").

In the hold mode of FIG. 13, the HOLD_BAR maintenance signal is active and Cl_1, CO_1 (825)=00. The input "0" in each multiplexer (1303-1305) is selected and the current state of the flip-flops at RDO0-RDO15 (1312) are loaded back through SDI0-SDI15 (1311), and hence the Data In/Out Register (520) data holds.

In the shift mode of FIG. 13, CONT (821)=0, and Cl_1, CO_1 (825)=10. Therefore, input "0" of the multiplexer (1302) and input "2" of the multiplexers (1303-1305) are selected. The last bit of the Write Enable Register 521, WENSO6 (1206) is shifted through the flip-flops, through SDI0-SDI15 (1311) inputs and RDO0-RDO15 (1312) outputs.

In the test mode, HOLD_BAR and TESTMODE_BAR signals are active, SHIFT_BAR signal is inactive. CONT (821) signal is "1". Cl_1, CO_1 (825) will depend on the value of T6 (806), T5 (805) (in FIG. 8) flip-flops. The test mode functions are summarized below in Table IV.

TABLE IV

Figure 16:
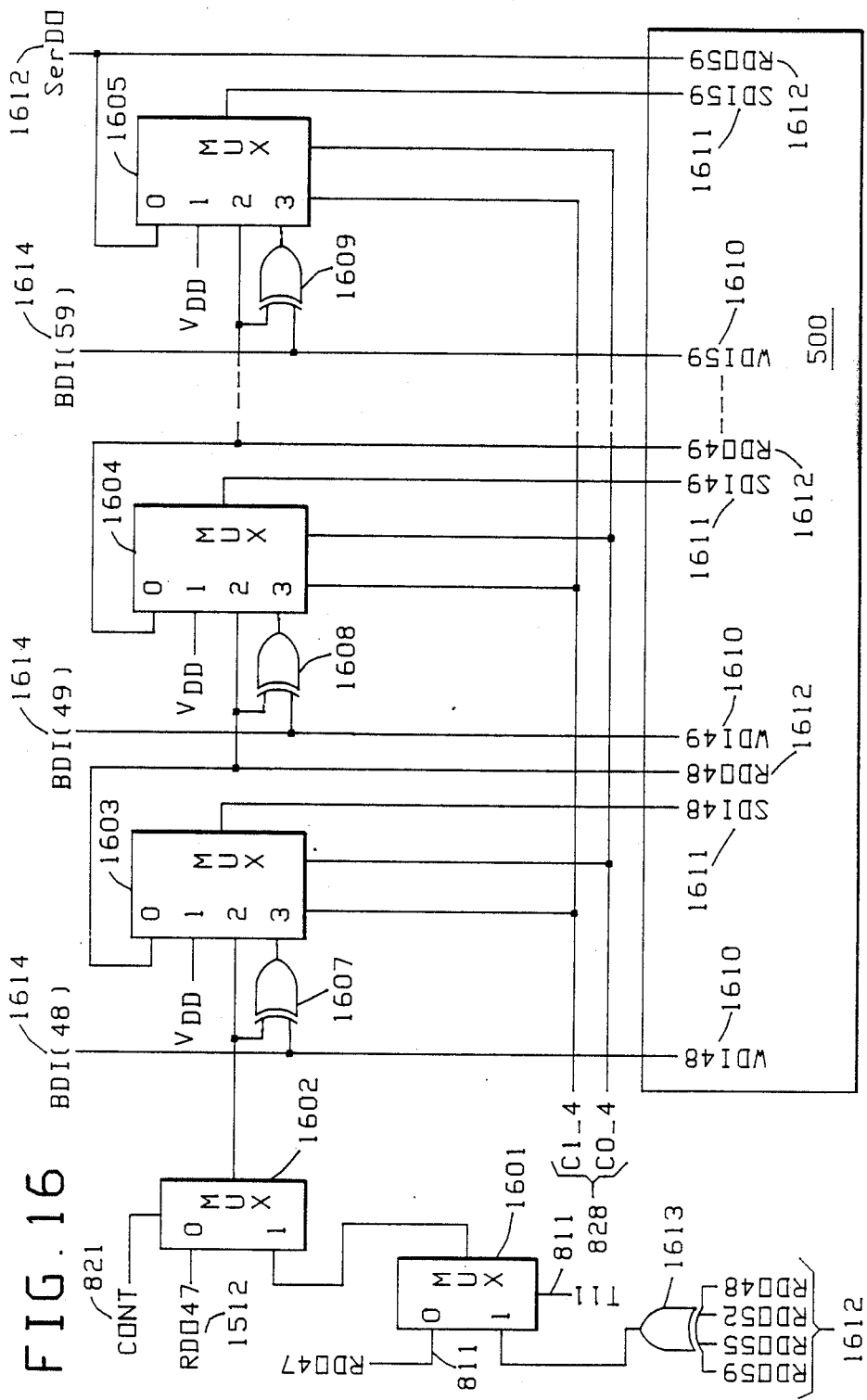
FIG. 16 is the circuitry holding the fourth slice of 12 bits of the 60-bit Data In/Out Register.

| TC | T6 | T5 | Cl_1 | CO_1 | FUNCTION |
|---|---|---|---|---|---|
| 0 | 0 | 0 | 1 | 0 | Pattern Generation: As a 60-bit shift register in conjunction with other parts of the Data In/Out Register, it generates walking bit patterns (looping). The Signal SerDO (1612) in FIG. 16 is wrapped around and input to the input "0" of the multiplexer (1301) and input "1" of the multiplexer (1302) and then the input "2" of the multiplexer (1303), to be serially loaded to the flip-flops. |
| 0 | 0 | 1 | 1 | 0 | Pattern Generation: As a 16-bit MFSR, The first slice of the Data I/O Register 520 generates random patterns. The primitive polynomial used is: $1X^4 + X^7 + X^9 + X^{16}$ The signals (1312) are EXORed by the gate (1313). The first bit of the register is determined through the input "1" of the multiplexers (1301) and (1302) and the input "2" of mutliplexer (1303). Other bits of the register are shifted. |
| 0 | 1 | 0 | 1 | 1 | A 60-bit signature collector is formed in conjunction with other parts (2nd,3rd and 4th slices) of the Data In/Out Register. The primitive polynomial used is: $1 + X + X^{60}$ The parallel data (1314) is EXORed by the gates (1307–1309) with the outputs of the flip-flops in the previous stages. The first bit is determined by the signals (1612) and gate (1306). |
| 0 | 1 | 1 | 0 | 0 | Hold |
| 1 | X | X | 0 | 0 | Hold |

Figure 14:
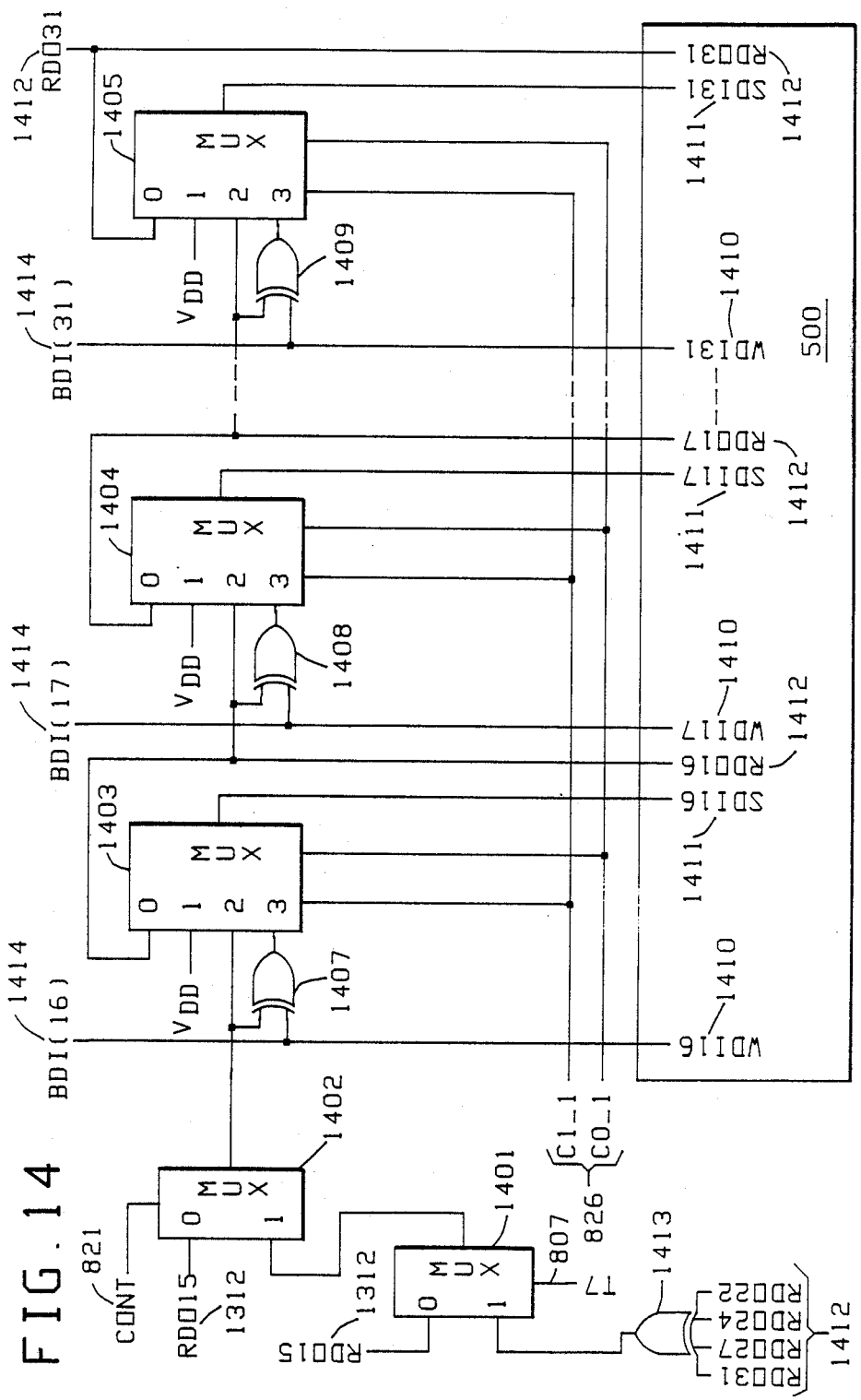
FIG. 14 is the circuitry holding the second 16-bit slice of the 60-bit Data In/Out Register.

FIG. 14 is the second 16-bit slice of the 60-bit Data In/Out Register of the RAM cell 500.

In the normal mode, all the maintenance signals are inactive, and SCAN input on the RAM cell is inactive ("0"). Therefore, parallel inputs WDI16–WDI31 (1410) are selected and parallel data BDI(16)–BDI(31) (1414) are loaded in parallel to the Data In/Out Register bits 16–31.

For all other modes of operation, serial data inputs SDI16–SDI31 (1411) and serial data outputs RDO16–RDO31 (1412) are used, since SCAN will be active ("1") when HOLD_BAR is active (0).

In the hold mode, HOLD_BAR maintenance signal is active and Cl_2, CO_2 (826)=00. The 0 input on each multiplexer (1403–1405) is selected and the current state of the flip-flops at RDO16–RDO31 (1412) are loaded back through SDI16–SDI31 (1411), and hence the Data I/O Register (520) data holds.

In the shift mode, CONT (821)=0 and Cl_2, CO_2 (826)=10. Therefore, input "0" of the multiplexer (1402) and the input "2" of the multiplexers (1403–1405) are selected. The last bit of the first slice of the Data In/Out Register RDO15 (1312) is shifted through the flip-flops (in the 2nd slice of Data I/O Register 520) through SDI16–SDI31 (1411) inputs and RDO16–RDO31 (1412) outputs.

In the test mode of FIG. 14, HOLD_BAR and TESTMODE_BAR signals are active; SHIFT_BAR signal is inactive. CONT (821) signal is "1". Cl_2, CO_2 (826) will depend on the values of T7 (807), T8 (808) (in FIG. 8) flip-flops. The test mode functions are summarized in Table V.

TABLE V

| TC | T8 | T7 | Cl_2 | CO_2 | FUNCTION |
|---|---|---|---|---|---|
| 0 | 0 | 0 | 1 | 0 | Pattern Generation: As a 60-bit shift register in conjunction with other slices of the Data In/Out Register, the Data I/O Register generates walking bit patterns (looping). The signal RDO15 (1312) is input to the input O of the multiplexer (1401) and input 1 of the multiplexer (1402) and the input 2 of the multiplexer (1403), providing a serial path for the data through the register. |
| 0 | 0 | 1 | 1 | 0 | Pattern Generation: As a 16-bit MFSR, it generates random patterns. The primitive polynomial used is: $1 + X^4 + X^7 + X^9 + X^{16}$ The signals (1412) are EXORed by the gate (1413). The first bit of the register (involving the 2nd slice of Data I/O Register 520) is determined through the input 1 of the multiplexers (1401) and (1402) and the input 2 of the multiplexer (1403). Other bits of the register are shifted. |
| 0 | 1 | 0 | 1 | 1 | A 60-bit signature collector is formed in conjunction with other slices of the Data In/Out Register. The primitive polynomial used is: $1 + X + X^{60}$ The parallel data (1410) is EXORed by the gates (1407–1409) with the outputs of the flip-flops in the previous stages. The first bit is determined by the signal RDO15 (1312) on input 0 of the multiplexer (1401) and input 1 of the multiplexer (1402). |
| 0 | 1 | 1 | 0 | 0 | Hold |
| 1 | X | X | 0 | 0 | Hold |

Figure 15:
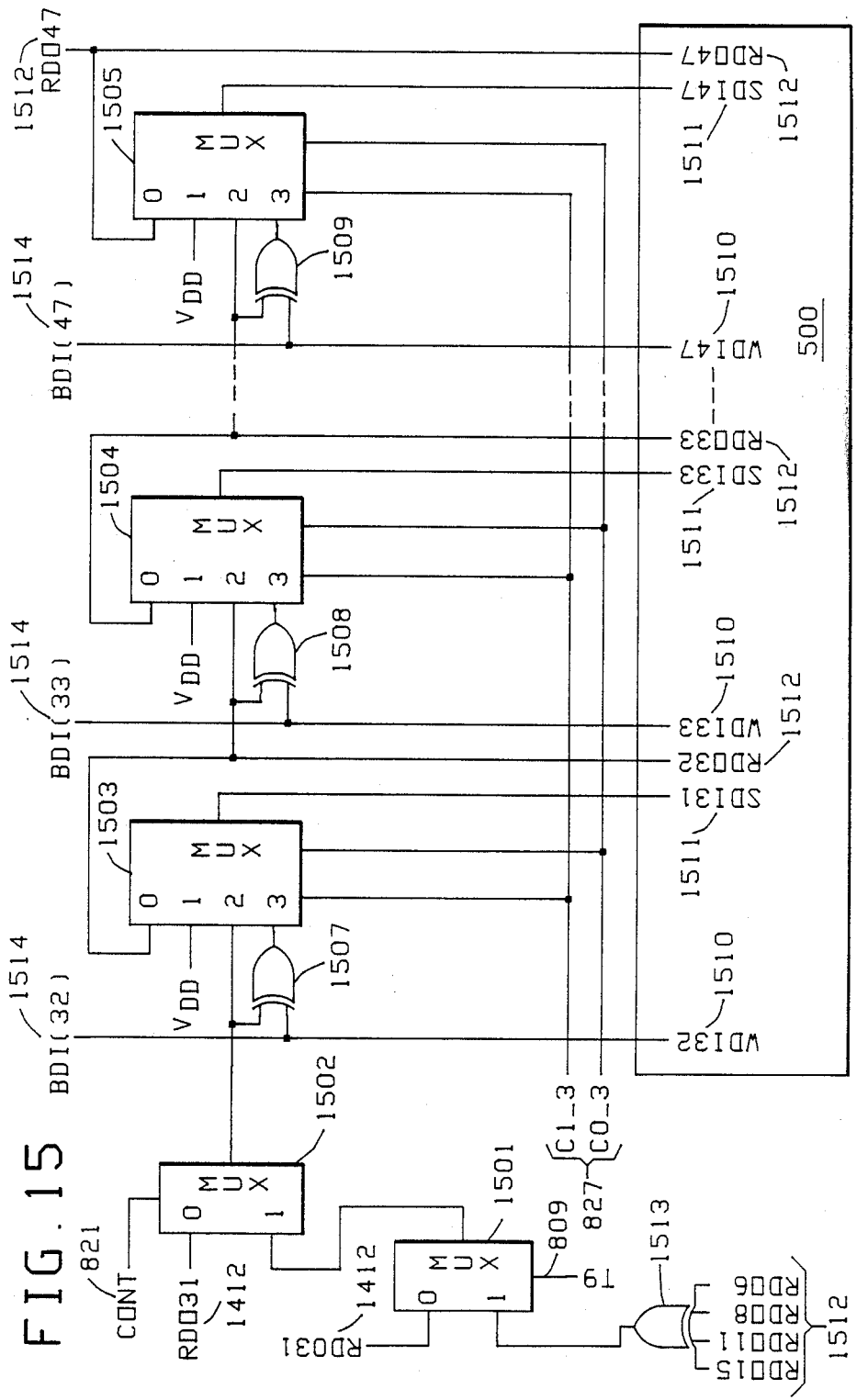
FIG. 15 is the circuitry holding the third 16-bit slice of the 60-bit Data In/Out Register.

FIG. 15 is the third 16-bit slice of the 60-bit Data In/Out Register 520 of the RAM cell 500.

In the normal mode of FIG. 15, all the maintenance signals are inactive, and SCAN input on the RAM cell is inactive ("0"). Therefore, parallel inputs WDI32–WDI47 (1510) are selected and parallel data BDI(32)–BDI(47) (1514) are loaded in parallel to the Data In/Out Register bits 32–47.

For all other modes of operation, serial data inputs SDI32–SDI47 (1511) and serial data outputs RDO32–RDO47 (1512) are used, SCAN will be active ("1") when HOLD_BAR is active ("0").

In the hold mode of FIG. 15, HOLD_BAR maintenance signal is active and Cl_3, CO_3 (827)=00. The zero input on each multiplexer (1503–1505) is selected and the current state of the flip-flops at RDO32–R-

DO47 (1512) are loaded back through SDI32-SDI47 (1511), and hence the register data holds.

In the shift mode of FIG. 15, CONT (821)=0 and Cl_3, CO_3 (827)=10. Therefore, input 0 of the multiplexer (1502) and input 2 of the multiplexers (1503-1505) are selected. The last bit RDO31 (1412) of the second slice of the Data In/Out Register 520 is shifted through the flip-flops of the 3rd slice of Data I/O Register 520; through SDI32-SDI47 (1511) inputs and RDO32-RDO47 (1512) outputs.

In the test mode of FIG. 15, HOLD_BAR and TESTMODE_BAR signals are active ("0"); SHIFT_BAR signal is inactive ("1") and CONT (821) signal is inactive ("1"). Cl_3, CO_3 (827) will depend on values of the T9 (809), T10 (810) (in FIG. 8) flip-flops. The test mode functions are summarized below in Table VI.

TABLE VI

| TC | T10 | T9 | Cl_3 | CO_3 | FUNCTION |
|---|---|---|---|---|---|
| 0 | 0 | 0 | 1 | 0 | Pattern Generation: As a 60-bit shift register in conjunction with other slices of the Data In/Out Register, the Data I/O Register generates walking bit patterns (looping). The signal RDO31 (1412) is input to the input 0 of the multiplexer (1501) and input 1 of the multiplexer (1502) and input 2 of the multiplexer (1503), providing a serial path for the data through the register. |
| 0 | 0 | 1 | 1 | 0 | Pattern Generation: As a 16-bit MFSR, the 3rd slice of the Data I/O Register generates random patterns. The primitive polynomial used is $1 + X^4 X^7 + X^9 + X^{16}$ The signals (1512) are EXORed by the gate (1513). The first bit of the register is determined through the input 1 of the multiplexer (1501) and (1502) and the input 2 of the multiplexer (1503). Other bits of the register are shifted. |
| 0 | 1 | 0 | 1 | 1 | A 60-bit signature collector is formed in conjunction with other slices of the Data In/Out Register. The primitive polynomial used is: $1 + X + X^{60}$ The parallel data (1514) is EXORed by the gates (1507-1509) with the outputs of the flip-flops in the previous stages. The first bit is determined by the signal RDO31 (1412) on input 0 of multiplexer (1501) and input 1 of the multiplexer (1502). |
| 0 | 1 | 1 | 0 | 0 | Hold |
| 1 | X | X | 0 | 0 | Hold |

FIG. 16 is the fourth slice (12-bits) of the 60-bit Data In/Out Register 520 of the RAM, 500.

In the normal mode, all the maintenance signals are inactive, and SCAN input (shown at 821, FIG. 8 and 511, FIG. 10) on the RAM cell is inactive ("0"). Therefore, parallel inputs WDI48-WDI59 (1610) are selected and parallel data BDI(48)-BDI(59) (1614) are loaded in parallel to the Data In/Out Register 520 as bits 48-59.

For all other modes of operation in FIG. 16, serial data inputs SDI48-SDI59 (1611) and serial data outputs RDO48-RDO59 (1612) are used, SCAN will be active ("1") when HOLD_BAR is active ("0").

In the hold mode, HOLD_BAR maintenance signal is active and Cl_4, CO_4 (828)=00. The 0 input on each multiplexer (1603-1605) is selected and the current state of the flip-flops in the 4th slice of Data I/O Register 520 at RDO48-RDO59 (1612) are loaded back through SDI48-SDI59 (1611), and hence the data in the Data I/O Register (520) holds.

In the shift mode, CONT (821)=0 and Cl_4, CO_4 (828)=10. Therefore, input 0 of the multiplexer (1602) and input 2 of the multiplexers (1603-1605) are selected. The last bit of the third slice of the Data In/Out Register designated RDO47 (1512) is shifted through the flip-flops of the 4th slice of Data I/O Register 520, through SDI48-SDI59 (1611) inputs and RDO48-RDO59 (1612) outputs.

In the test mode of FIG. 16, HOLD_BAR and TESTMODE_BAR signals are active ("0"); SHIFT_BAR signal is inactive ("1"). CONT (821) signal is inactive. Cl_4, CO_4 (828) will depend on values of the T11 (811), T12 (812) flip-flops (in FIG. 8). The test mode functions are summarized below in Table VII.

TABLE VII

| TC | T12 | T11 | Cl_4 | CO_4 | FUNCTION |
|---|---|---|---|---|---|
| 0 | 0 | 0 | 1 | 0 | Pattern Generation: As a 60-bit shift register in conjunction with other slices of the Data In/Out Register, the Data I/O Register generates walking (looping) bit patterns. The signal RDO47 (1512) is input to the input 0 of the multiplexer (1601) and input 1 of the multiplexer (1602) and input 2 of the multiplexer (1603), providing a serial path for the data through the Data I/O Register. |
| 0 | 0 | 1 | 1 | 0 | Pattern Generation: As a 16-bit MFSR, the Data I/O Register generates random patterns. The primitive polynomial used is: $1 + X^4 + X^7 + X^9 + X^{16}$ The signals (1612) are EXORed by the gate (1613). The first bit of the register is determined through the input 1 of the multiplexer (1601) and (1602) and the input 2 of the multiplexer (1603). Other bits of the register are shifted. |
| 0 | 1 | 0 | 1 | 1 | A 60-bit signature collector is formed in conjunction with other slices of the Data In/Out Register. The primitive polynomial used is: $1 + X + X^{60}$ The parallel data (1614) is EXORed by the gates (1607-1609) with the outputs of the flip-flops in the previous stages. The first bit is determined by the signal RDO47 (1512) on input 0 of the multiplexer (1601) and input 1 of multiplexer (1602). |

TABLE VII-continued

| TC | T12 | T11 | Cl_4 | CO_4 | FUNCTION |
|---|---|---|---|---|---|
| 0 | 1 | 1 | 0 | 0 | Hold |
| 1 | X | X | 0 | 0 | Hold |

Figure 17:
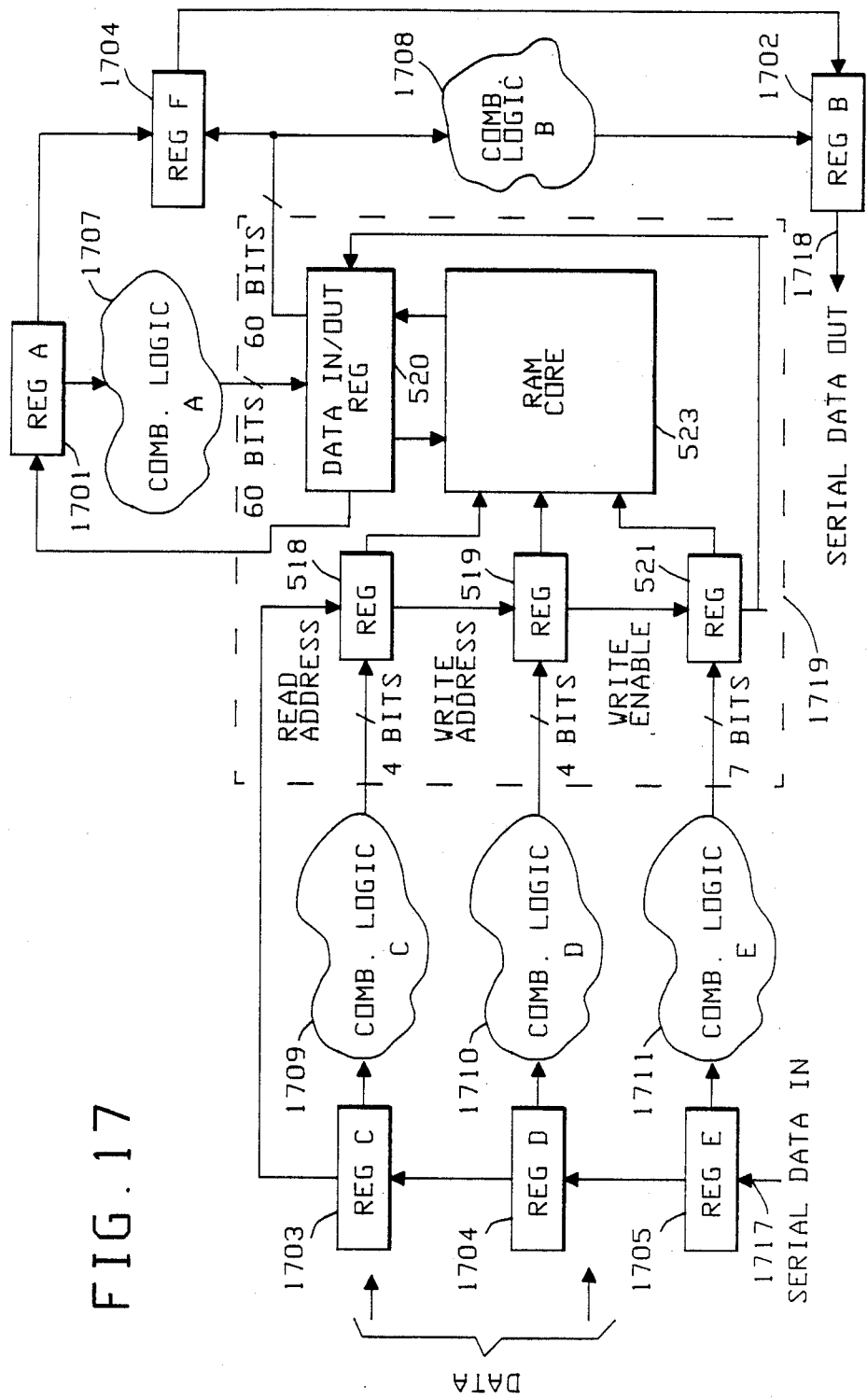
FIG. 17 illustrates how the invention is used in VLSI design work.

With respect to FIG. 17, there can be seen how either the RAM core 523 or various gate arrays of logic circuitry (combinatorial logic C, D, E, A, B) can be tested.

For example, focusing on the task of the basic RAM core 523, the following testing sequence can be effectuated:

1. A test pattern can be generated from registers 518, 519, 521 and 520 which provide inputs of the test patterns to the RAM core 523.

2. The pattern data is now written into the RAM core 523.

3. The registers 518, 519 and 521 will generate patterns which will address all of the RAM locations in the RAM core 523.

4. Then each location in the RAM core 523 is read out and placed into the register F, 1706, in order to collect the signature.

5. The maintenance controller 10 will read out register F (1706) and take a reading of the entire snake so as to make a comparison with the expected value.

6. If the entire snake, checked by the maintenance controller 10, matches the expected value, then there is no error. If there is no match, then there is an error reading which is signaled.

The T flip-flops 702 will determine the configuration of the registers as to whether they will be pattern generators or act to collect signatures. The T flip-flops (702) will thus control the registers 518, 519, 520 and 521.

The RAM core 523 holds the memory array which provides the storage capacity for the RAM memory. The entire area 1719 enclosed by the dotted line showing the circuit system of FIG. 17 is called the "RAM cell" and this is to indicate that it includes the RAM core plus the registers 518 through 521, and includes the T flip-flops 702.

Further, in regard to FIG. 17, it can be noted that the "chip snake" encompasses all of the aligned registers and flip-flops which start from the serial data in at 1717 on through the serial data out at 1718.

On the other hand, the "RAM snake" encompasses only registers 518 through 521 plus the T flip-flops 702 and the registers F (1706) and B (1702).

FIG. 17 shows a generalized high level diagram for a digital VLSI circuit with combinatorial circuits (1707-1711) and registers A–F (1701-1706) plus registers 518-521 all connected serially to each other to form the "chip snake" 70$_S$ of FIG. 1 with serial data input (1717), and serial data output (1718). The system circuitry is referenced by item 719. The T flip-flops 702, DDrive flip-flop 522 and Test Gen flip-flop 706 are not shown, in FIG. 17, for simplicity. No maintenance control signals are shown. The registers A–F (1701-1706) must be designed as MFSRs having the functions of:

(a) Normal operation mode: Parallel Load; Hold;

(b) Maintenance mode: Shift; Hold; Pattern Generate; Signature Collect.

The use of this system in a VLSI design is two-fold, as follows:

1. External testing: The combinatorial logics A, C, D, E (1707, 1709-1711) that are used in the design to generate the inputs to the Data I/O Register 520, Read Address Register 518, Write Address Register 519, and Write Enable Register 521 for the RAM may be exhaustively tested, by configuring registers A, C, D, E (1701, 1703-1705) as pattern generators and using registers (518-521) in the newly developed circuit (1719) as signature collectors.

Combinatorial logic B (1708) may be tested by generating patterns by the Data In/Out Register 520 of the RAM 500. In this case, signatures will have to be collected by register B (1702) connected to the outputs of the logic B, 1708.

2. Internal Testing: By configuring all the registers (518-521) as pattern generators, random data may be written to the RAM core (523). Then, by configuring the Read Address Register (518) only as a pattern generator, the RAM 500 may be read out; but the signature will have to be collected on an external register F (1706) that is set up as a signature collector.

An algorithm that may be used to test the RAM is shown in FIG. 18, along with the control signal levels and register configurations.

Also, by toggling the HOLD_BAR signal, single clock cycle operations may be performed, which is a method used in a system debug environment.

FIG. 18 illustrates an algorithm which is summarized below and may be used to test the RAM.

In the algorithm, every two steps constitute a test case. Each test case is preceded by a shift-in operation, so that registers may be set up with certain data and control information; and followed by a shift-out operation so the signature may be read out and compared with the expected value. For the execution of each step, the TESTMODE_BAR is activated, and the operation continues until TC=1. When TC=1, all the registers go into hold.

It may be noted that the odd numbered steps of FIG. 18 involve a Write operation. The Write Address Register is a 4-bit counter. For it to generate all possible patterns, 16 clocks are required.

The even numbered steps of FIG. 18 involve signature collection,—that is,—a Read operation. The Test Gen flip-flop and Read Address Register 518 form a 5-bit MFSR. In order to get the "all zeros" pattern on the Read Address Register,—that is,—"10000" on the MFSR, 32 clocks are required.

Figure 19:
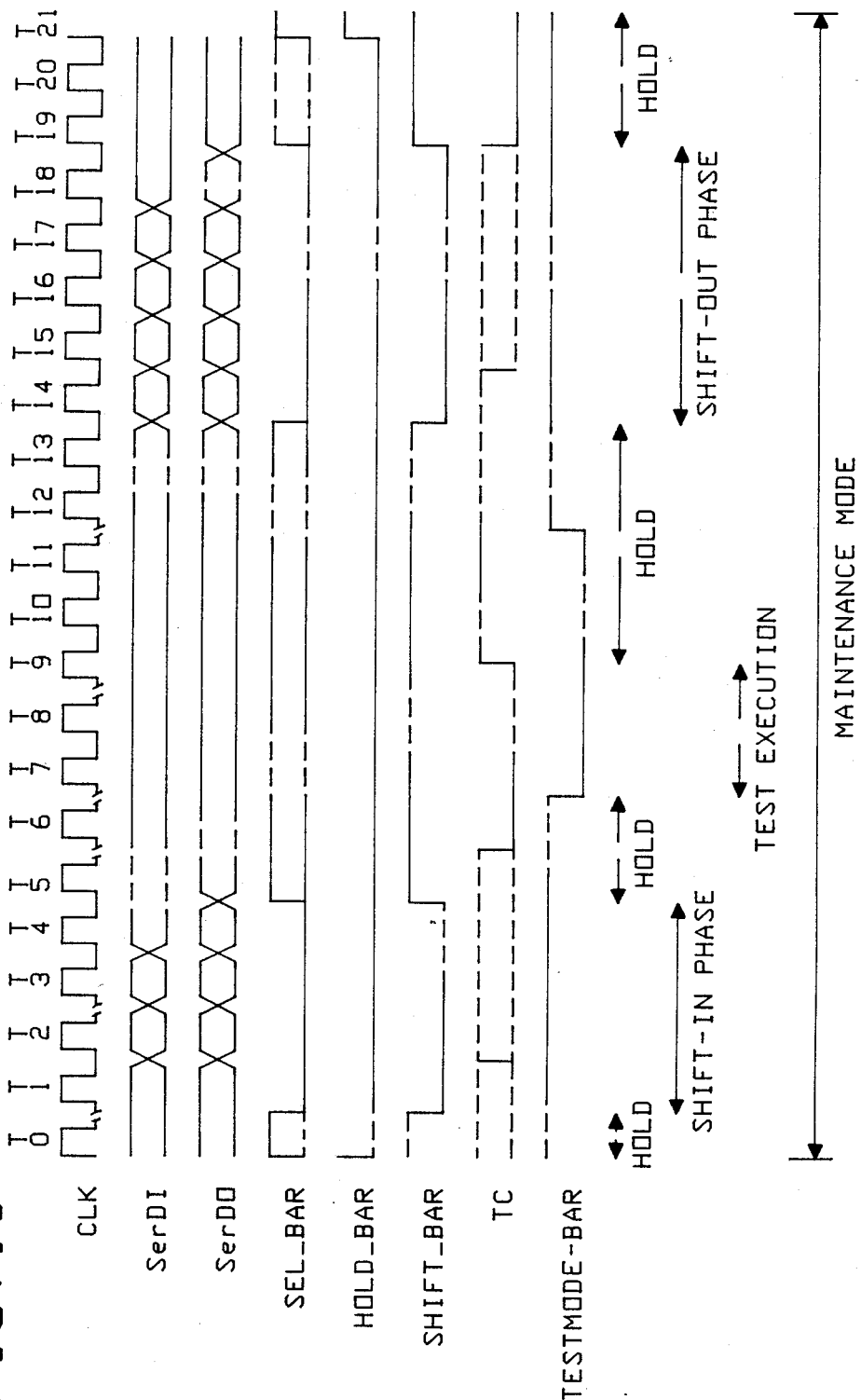
FIG. 19 shows the typical timing for the self-test sequence of operations.

FIG. 19 shows a typical timing and sequence of operations that are performed for a RAM self-test execution.

The first maintenance signal that is asserted is the HOLD_BAR to put the system in maintenance mode. At time T0, HOLD_BAR is asserted. Now, all the flip-flops are frozen, ready for a shift operation. Next, SEL_BAR must be asserted, so the shift operation will take place on the chip snake 70$_S$ (not on other snakes) in the chip. SEL_BAR may be asserted any time before SHIFT_BAR is asserted. SHIFT_BAR is activated at time T1 on the diagram. As long as SHIFT_BAR is active, at each clock, one bit of data will be shifted. Therefore, SerDI must have valid bit data at each clock. SerDO shows the data shifted out in the RAM snake.

During the shift operation, TC 30$_S$ may be any value. Shift is complete at T5. At that time, SEL_BAR may be asserted. TC must be inactive. The test counter must have the correct clock count, either 16 or 32, depending on the step to be executed. Some time later, TESTMODE_BAR is asserted,—for example, at T7. Then the test counter will start counting, to generate a TC after 16 clocks (or 32 clocks). Pattern generators will generate patterns and signature collectors will collect signatures. If, for example, the terminal count is reached at time T10 and TC goes active,—the test stops and the system goes to hold mode although TESTMODE_BAR is still active. Sometime later, TESTMODE_BAR is deactivated, for example at T12, because a shift operation has to start. The shift operation here is exactly the same as the first shift operation.

On the diagram of FIG. 19, different phases of operation are also shown, such as the hold, shift-in phase, hold, test execution, hold, shift-out phase, and hold—all of which are in the maintenance mode.

The same timing is also used to initialize the chip for normal operation, except that test execution phase is not required. After the shift operation is complete with the proper initialization data in the snake, HOLD_BAR is deasserted and the chip goes into normal mode.

Figure 19A:
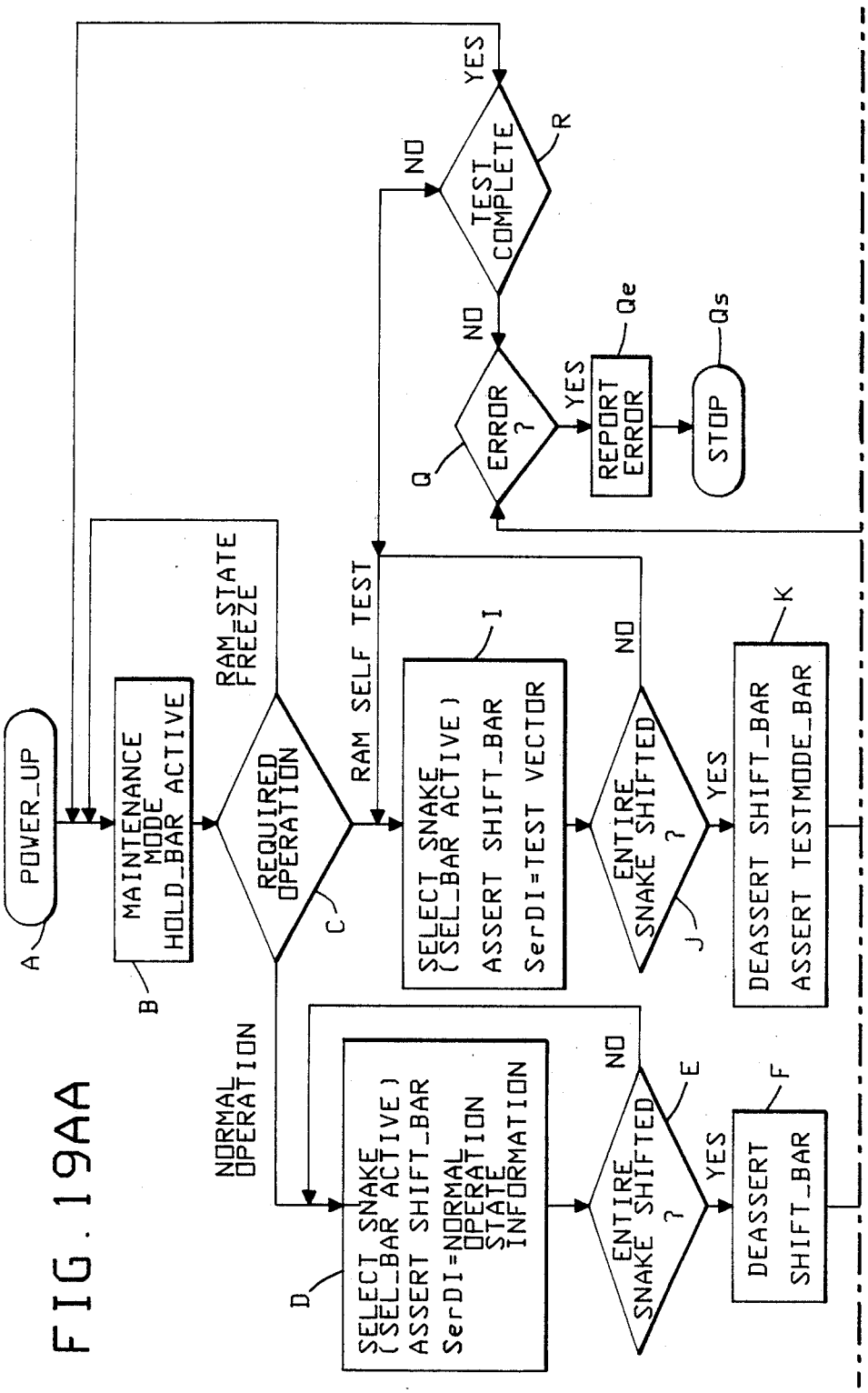
FIG. 19A shows a flow chart for normal and self-test operation.

FIG. 19A shows the RAM initialization for normal operation mode and self-test mode mode as a flow chart sequence.

Figure 18A:
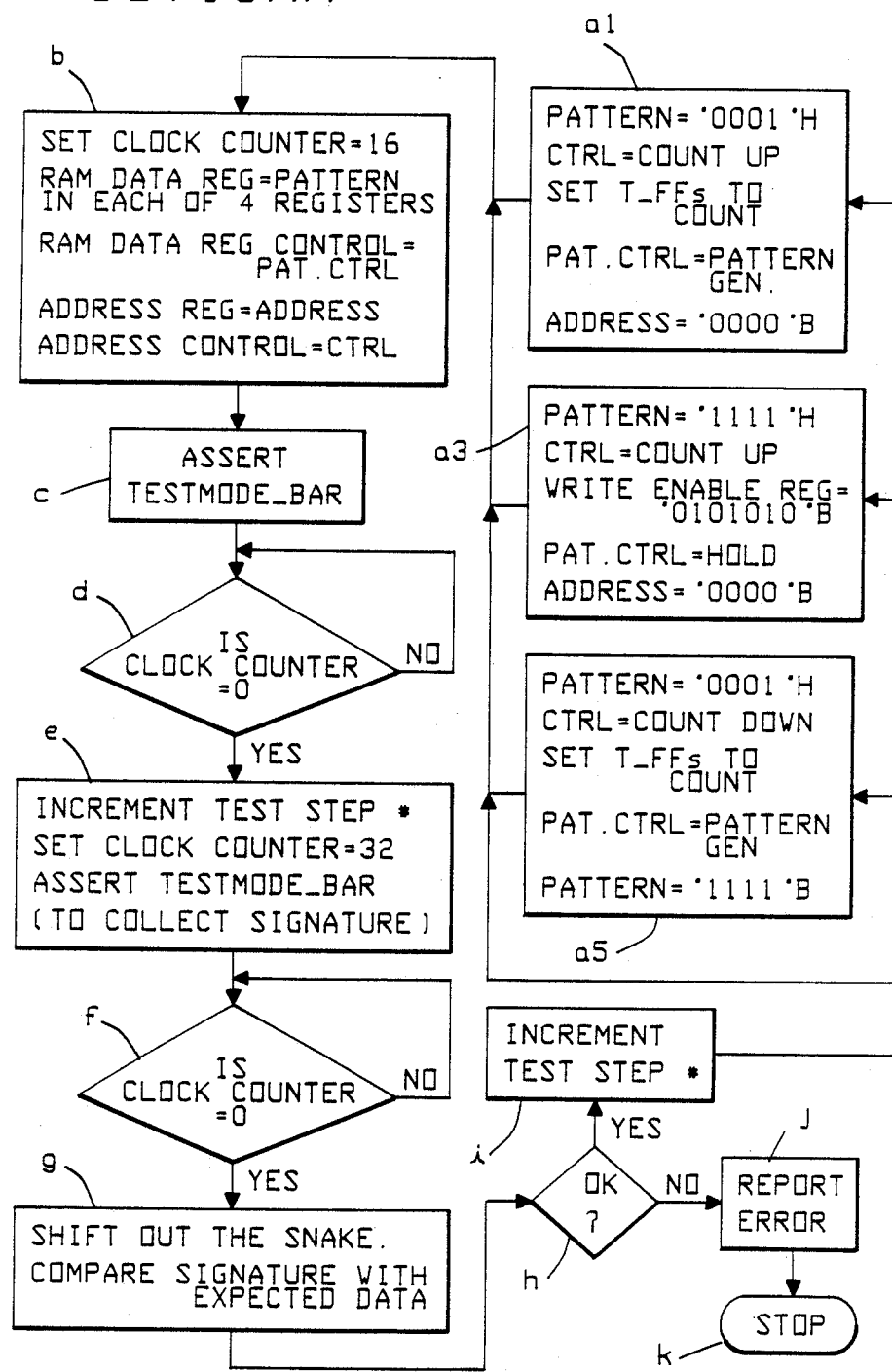
FIG. 18A which illustrates a flow chart of operation.

FIG. 18A shows a flow chart indicating the steps involved in the RAM self-test operation.

In test step No. 1, the seed "0001" is set (a1) after which the clock counter is set to 16 and a pattern is set into each of four RAM data registers, at block (b). Subsequently, the circuitry asserts the TESTMODE_BAR at block (c) until the clock counter is at "0" block (d). Subsequently, the test step number is incremented and clock counter is set to 32 at block (e) after which the circuitry asserts the TESTMODE_BAR in order to collect signatures.

When the clock counter has been decremented to zero at decision block (f), then the circuitry will shift out the snake and compare the signatures with the expected data.

If the signature comparison checks out properly at block (h), then the next test step number is incremented (i). If not, then a report (j) is made to the maintenance controller of an error and the circuitry will come to an operational halt (k).

The next test step operation would be indicated as No. 3, in which the seed "1111" is set at (a3) while the Write Enable Register is conditioned with a pattern of "0101010" after which the previously used routines (b), (c), (d), (e), (f), (g), etc. is effectuated.

Subsequently, the next test step No. 5 is effectuated as seen in block (a5) where the seed "0001" is set. The T flip-flop 702 of FIG. 7 are put into the "count" mode after which a starting address of "1111" is set. After the items in block (a5) are generated, then the sequence continues through blocks (b, c, d, e, f, g, etc.).

The next test step is the test step No. 7 shown in block (a7) where the pattern is generated of "1111" and the Write Enable Register is loaded with "1010101". After this, the sequence continues through blocks (b, c, d, e, f, g, etc.).

The next operation involves test step No. 9 shown in block (a9) where the seed is "0000" and the setting of the T flip-flops (702 of FIG. 7) to the count mode. The pattern will be written into all locations starting at the address "1111" after which the sequence will continue through steps (b, c, d, e, f, g, etc.).

In FIG. 19A, there is seen a flow chart showing the RAM initialization for the normal operation mode and for the self-test execution.

1. At power-up time (A), the maintenance mode (B) is initiated with the implementation of the HOLD_BAR which is made active. Decision block (C) will then set a course of action for "normal operation" or for the RAM self-test operation.

Following the normal operation sequence, it will be seen that in block (D) the snake is selected with the assertion of the SHIFT_BAR whereupon the serial data input functions under normal operation (block D).

Once the entire snake is shifted (E), then the SHIFT_BAR is deasserted (F). The next operation is the deassertion of the HOLD_BAR signal after which the RAM is in the normal mode (H).

Returning to the decision block (C), for the RAM self-test operation, block (I) indicates the selection of the snake and the assertion of the SHIFT_BAR after which the serial data input is provided with a test vector.

After the entire snake has been shifted at decision block (J), then the SHIFT_BAR is deasserted and TESTMODE_BAR is now asserted at (K).

At decision block (L), a check is made to see that the TC signal from the Test Check Counter is active, and if so, then block (M) comes into play to deassert the TESTMODE_BAR. At block (N), the SHIFT_BAR is asserted and a read-out is made of the serial data output (SDO).

At decision block (O), a determination is made as to whether the shift is complete. If so, then at block (P), the signature developed is now compared with the expected (in the maintenance controller) signature at which time the decision block (Q) determines whether or not an error occurred.

If no error has occurred, then decision block (R) signifies the test is completed and a return is made to the maintenance mode block (B).

At the decision block (Q), if an error was detected because the signature did not compare with the expected signature, the block ($Q_E$) will report the error to the maintenance controller 10 and at block ($Q_E$) the system will be made to come to a halt or stop.

There has been described herein the architecture for a VLSI circuit in which the combinatorial logic of the circuit (such as a RAM memory array, logic array and gate array circuitry registers and flip-flops control logic circuitry) can be implemented with built-in, self-testing functions.

Thus, for example, a RAM core memory array structure for holding a multiplicity of data words is used as the basis for a RAM cell which includes a series of registers and logic. The cooperating registers, such as a read address, a write address register, a write enable register, a data in/out register, plus combinatorial logic circuitry such as a data drive register, read and write address decoders control logic including a plurality of flip-flops used for control purposes may all be controlled in a fashion to selectively convert the registers into multifunction shift registers which can be connected in a serial fashion to form a snake and thereupon selective registers can be used as test pattern generators to other of the registers and to other parts of the combinatorial logic so as to generate signatures which can be collected in selected ones of the registers. Thereupon a maintenance controller, which controls the mode of operation from a normal read/write memory mode into a test and shift mode can be used to access the collected signatures and check them to see whether proper operability of the circuit and including its registers and combinatorial logic is operating properly or not.

One of the control functions involved is the convertibility of the registers from being ordinary latches into being multifunction shift registers acting as flip-flops whereby data can be shifted through the registers which are connected in a serial fashion to form a snake. Input data can be shifted through the snake and the data of the snake can be read out by the maintenance controller in order to check the serial snake data for correct comparison to a predetermined set of data criteria to indicate whether proper operation is being effectuated.

While other implementations of the above-described concept and functions may be effectuated, it should be understood that the present system is encompassed by the following claims.

What is claimed is:

1. In a VLSI integrated circuit chip structure which includes a RAM memory array and combinatorial logic circuitry having registers which are controlled to perform either as latches or flip-flops, a method for internal testing of said RAM memory array and said combinatorial logic circuitry which includes the steps of:
   (a) connecting said registers in serial concatenation to form a shift chain circuit;
   (b) initializing said shift chain circuit to make said registers function as multifunction shift registers (MFSR) flip-flops;
   (c) initializing one or more of said MFSR's to receive an input and to generate an output test data pattern for input to said combinatorial logic circuitry while inhibiting the operation of all other MFSR's except an output MFSR;
   (d) initializing a test counter circuit for controlling the number of test pattern data into said output MFSR;
   (e) collecting output test data from said combinatorial logic circuitry for placement in said output MFSR as a signature;
   (f) accessing said signature, in said output MFSR, by a maintenance controller;
   (g) comparing said accessed signature with a predetermined signature to assess whether said combinatorial logic circuitry is operating properly without error.

2. The method of claim 1 wherein step (c) operates additionally as the step of:
   (c1) initializing a sequence of operations where said second MFSR receives an input and generates test data patterns to said combinatorial logic circuitry while said first, third, fourth, fifth, etc. MFSR's are in a hold mode with the exception of said output MFSR.

3. The method of claim 1 wherein step (c) operates as the step of:
   (c2) initializing a sequence of operations where said first and second MFSR's receive input and generate test data patterns to said combinatorial logic circuitry while said third, fourth, fifth, etc. MFSR's are in a hold mode with the exception of said output MFSR which collects said signature.

4. The method of claim 1 which includes the step of:
   (h) inhibiting the operation of said RAM memory array during testing of said combinatorial logic circuitry.

5. The method of claim 4 which includes the steps of:
   (j) supplying serial test data for shifting into said shift chain circuit;
   (k) accessing said serial test data in said shift chain circuit by a maintenance controller;
   (l) performing internal self-testing of said RAM memory array to establish a signature in said output MFSR;
   (m) comparing said signature with a predetermined standard signature to assess that said RAM memory array is operating without errors.

6. The method of claim 4 which includes the steps of:
   (n) initializing a first one or more of said MFSR's to generate a test data word pattern for input into said RAM memory array while all other MFSR's remain in hold mode except said output MFSR which is configured as a signature collector;
   (o) generating RAM memory array addresses to access each test data word in said RAM memory array;
   (p) collecting each accessed data word from said RAM memory array for placement into said output MFSR as a signature;
   (q) accessing said signature for comparison with a predetermined signature to indicate proper or improper RAM memory array operation.

7. In a VLSI circuit having built-in self-test capability, the combination comprising:
   (a) a RAM cell memory array including:
      (a1) a RAM core memory for storing M words with each word having N bits;
      (a2) combinatorial logic circuitry including:
         (a2a) a D-drive register for using algorithmically generated patterns;
         (a2b) a write address decoder circuit;
         (a2c) a read address decoder circuit;
         (a2d) control logic circuitry;
      (a3) a plurality of register means including:
         (a3a) a write address register;
         (a3b) a read address register;
         (a3c) a data I/O register;
      wherein said registers may be connected in serial relationship to form a concatenated shift chain and controlled for conversion from a normal function as latches, to a shift mode function as flip-flops.
   (b) a plurality of auxiliary control flip-flops connected to a controller for controlling and configuring the functions of said logic circuitry and said registers;
   (c) a test counter connected into said serially connected concatenated shift chain for generating a control signal to terminate the test cycle and set said registers into a hold mode;
   (d) said maintenance controller for providing control signals permitting normal operation of said RAM core and RAM cell memory array, and also providing for control of test mode conditions whereupon selected registers are initiated into generating test patterns while other selected registers are initiated into collecting signature data and enabling transmission of said signature data to said maintenance controller for comparison with a predetermined signature to determine proper operability of the circuitry.

8. The combination of claim 7 wherein said auxiliary control flip-flops are connected as part of said shift chain and function, with control signals, to convert said registers into flip-flops enabling operation as multifunction shift registers (MFSR's).

9. The combination of claim 8 which includes:
   (a) means for initiating a control program so that a first multifunction shift register generates patterns for said combinatorial logic circuitry while said second and subsequent multifunction shift registers are inoperative and holding;
(b) means for controlling an output multifunction shift register to collect signature data from said combinatorial logic circuitry for a period determined by said test counter, which signature data can be transmitted to said maintenance controller for comparison with a predetermined signature.

10. The combination of claim 9 wherein a second multifunction shift register is made to function as a test pattern generator while said first multifunction shift register is in a stop or holding condition, said test patterns generated from said second multifunction shift register being transmitted to said combinatorial logic circuitry which provides an output pattern to said output multifunction shift register which can collect the output pattern as a signature and transmit the signature to said maintenance controller for comparison with a predetermined signature.

* * * * *